US009711235B2

(12) United States Patent
Gangasani et al.

(10) Patent No.: US 9,711,235 B2
(45) Date of Patent: Jul. 18, 2017

(54) NONVOLATILE MEMORY DEVICE, STORAGE DEVICE HAVING THE SAME, OPERATING METHOD THEREOF

(71) Applicants: Venkataramana Gangasani, Suwon-si (KR); Jin-Yub Lee, Seoul (KR); Sungwhan Seo, Hwaseong-si (KR); Won-Tae Kim, Seongnam-si (KR); Dojeon Lee, Seoul (KR); Yohan Lee, Incheon (KR)

(72) Inventors: Venkataramana Gangasani, Suwon-si (KR); Jin-Yub Lee, Seoul (KR); Sungwhan Seo, Hwaseong-si (KR); Won-Tae Kim, Seongnam-si (KR); Dojeon Lee, Seoul (KR); Yohan Lee, Incheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/295,536

(22) Filed: Oct. 17, 2016

(65) Prior Publication Data

US 2017/0117054 A1 Apr. 27, 2017

(30) Foreign Application Priority Data

Oct. 23, 2015 (KR) .................. 10-2015-0148317

(51) Int. Cl.
*G11C 16/34* (2006.01)
*G11C 16/04* (2006.01)
(Continued)

(52) U.S. Cl.
CPC ...... *G11C 16/3431* (2013.01); *G11C 16/0466* (2013.01); *G11C 16/0483* (2013.01);
(Continued)

(58) Field of Classification Search
USPC .................................................. 365/185.02
See application file for complete search history.

(56) References Cited

U.S. PATENT DOCUMENTS 5,633,823 A 5/1997 Lee
5,822,252 A 10/1998 Lee et al.
(Continued)

FOREIGN PATENT DOCUMENTS

KR 100634155 B1 10/2006

*Primary Examiner* — Hoai V Ho
*Assistant Examiner* — Minh Dinh
(74) *Attorney, Agent, or Firm* — Volentine & Whitt, PLLC

(57) ABSTRACT

A nonvolatile memory device includes a voltage generating circuit configured to generate voltages applied to word lines corresponding to a selected memory block among memory blocks. The voltage generating circuit includes voltage source lines having linear voltages, a first voltage generating unit configured to generate a first voltage and apply the generated first voltage to a first voltage source line among the voltage source lines, a second voltage generating unit configured to generate a second voltage and apply the generated second voltage to a second voltage source line among the voltage source lines, and a linear voltage generator having a resistor string connected between the first voltage source line and the second voltage source line. At least one of the voltage source lines has a voltage distributed between the first voltage and the second voltage.

20 Claims, 29 Drawing Sheets

(51) Int. Cl.
*G11C 16/08* (2006.01)
*G11C 16/16* (2006.01)
*G11C 16/10* (2006.01)
*G11C 16/26* (2006.01)

(52) U.S. Cl.
CPC ............ *G11C 16/08* (2013.01); *G11C 16/10* (2013.01); *G11C 16/16* (2013.01); *G11C 16/26* (2013.01)

(56) References Cited

U.S. PATENT DOCUMENTS

| | | |
|---|---|---|
| 7,269,070 B2 | 9/2007 | Kim |
| 7,397,706 B2 | 7/2008 | Byeon et al. |
| 7,495,955 B2 * | 2/2009 | Ido .................... G11C 8/08 365/185.02 |
| 7,532,531 B2 | 5/2009 | Lee |
| 7,679,133 B2 | 3/2010 | Son et al. |
| 7,825,698 B2 | 11/2010 | Tran et al. |
| 7,835,193 B2 | 11/2010 | Lee |
| 8,406,061 B2 | 3/2013 | Choi |
| 8,553,466 B2 | 10/2013 | Han et al. |
| 8,559,235 B2 | 10/2013 | Yoon et al. |
| 8,576,635 B2 * | 11/2013 | Kim .................... G11C 16/0483 365/185.22 |
| 8,654,587 B2 | 2/2014 | Yoon et al. |
| 8,659,971 B2 | 2/2014 | Wang et al. |
| 2009/0316491 A1 * | 12/2009 | Park .................... G11C 16/0483 365/185.29 |
| 2011/0182125 A1 | 7/2011 | Itoh et al. |
| 2011/0233648 A1 | 9/2011 | Seol et al. |
| 2015/0221375 A1 * | 8/2015 | Choi .................... G11C 16/10 365/185.22 |

* cited by examiner

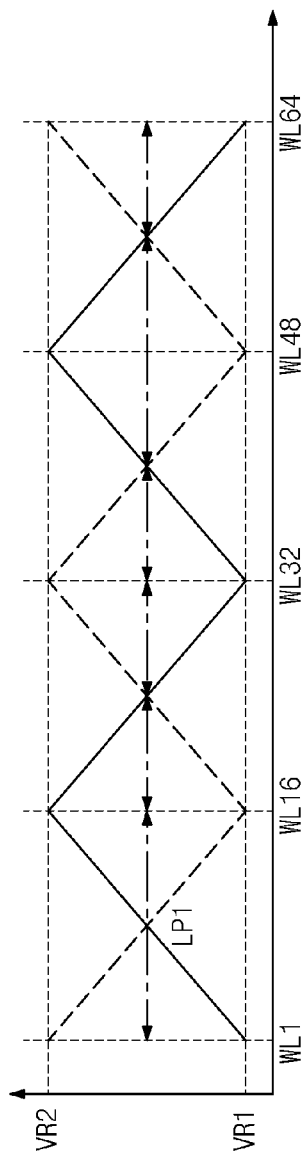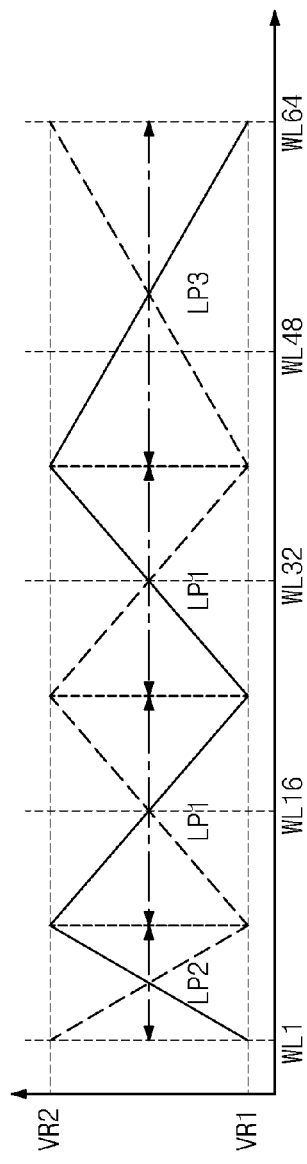

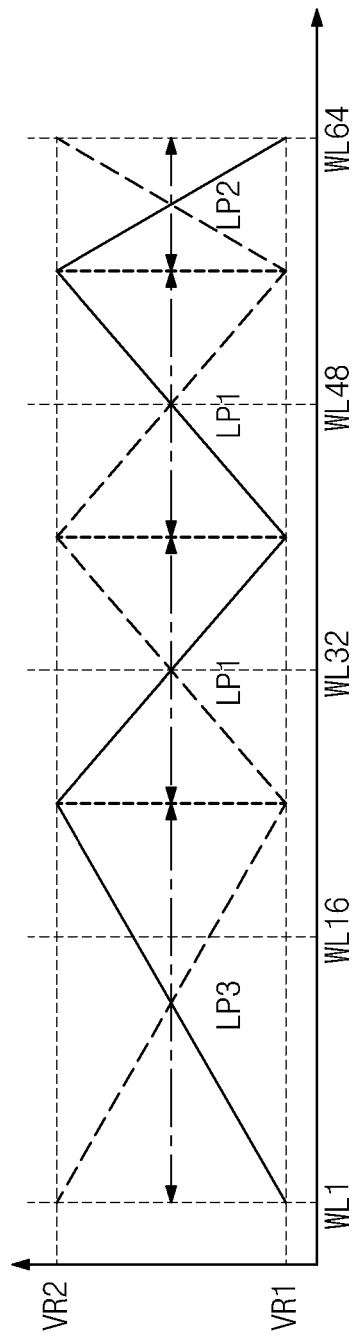

NONVOLATILE MEMORY DEVICE, STORAGE DEVICE HAVING THE SAME, OPERATING METHOD THEREOF

CROSS-REFERENCE TO RELATED APPLICATION

This U.S. non-provisional patent application claims priority under 35 U.S.C. §119 to Korean Patent Application No. 10-2015-0148317 filed on Oct. 23, 2015, the subject matter of which is hereby incorporated by reference.

BACKGROUND

The disclosure described herein relates to a nonvolatile memory device, a storage device having the same, and an operating method thereof.

Semiconductor memory devices are generally classified into volatile memory devices and nonvolatile memory devices. A nonvolatile memory device can retain stored data even when not powered. Data stored in the nonvolatile memory device may be permanent or reprogrammed, depending on the fabrication technology used. Nonvolatile memory devices are generally used for user data, program and microcode storage in a wide variety of applications in the computer, avionics, telecommunications, and consumer electronics industries.

SUMMARY

Embodiments of the disclosure provide a nonvolatile memory device, a storage device having the same, and an operating method thereof.

Embodiments of the disclosure are directed to provide a nonvolatile memory device including a plurality of memory blocks having a plurality of strings which are perpendicular to a substrate and are connected to one bit line. Each of the cell strings includes a plurality of memory cells corresponding to word lines, respectively. A voltage generating circuit generates voltages to be applied to word lines corresponding to a memory block selected from the memory blocks. The voltage generating circuit may include voltage source lines having the voltages corresponding to the word lines, a first voltage generating unit configured to generate a first voltage and apply the first voltage to a first voltage source line of the voltage source lines, a second voltage generating unit configured to generate a second voltage and apply the second voltage to a second voltage source line of the voltage source lines, and a resistor string connected between the first voltage source line and the second voltage source line. At least one of the voltage source lines may have a voltage between the first voltage and the second voltage divided using the resistor string.

Embodiments of the disclosure are directed to provide a storage device including at least one nonvolatile memory device. A memory controller controls the at least one nonvolatile memory device. The at least one memory device may include a plurality of memory blocks having a plurality of strings which are perpendicular to a substrate and are connected to one bit line. Each of the cell strings may include a plurality of memory cells corresponding to word lines, respectively. A linear voltage generator generates linear voltages, which are to be applied to word lines corresponding to a memory block selected from the memory blocks, in a voltage division manner using a resistor string. The linear voltages may linearly increase or decrease at all or a portion of adjacent word lines during a program, a read, or an erase operation.

Embodiments of the disclosure are directed to provide a method of operating a nonvolatile memory device having a plurality of strings perpendicular to a substrate. The method may include generating a source voltage, generating linear voltages by dividing a voltage between the source voltage and a ground voltage using a resistor string, and applying the linear voltages to word lines. The linear voltages are word line voltages which linearly increase or decrease at all or a portion of adjacent word lines during a program, a read, or an erase operation.

Embodiments of the disclosure are directed to provide a nonvolatile memory device including word lines. An erase voltage generator generates word line erase voltages to be applied to the word lines during an erase operation. The erase voltage generator may include pass transistors configured to electrically connect the word lines to voltage source lines, a resistor string configured to electrically connect the voltage source lines, a plurality of voltage generating units configured to generate voltages corresponding to a portion of the voltage source lines and apply the generated voltages to the corresponding voltage source lines, and a high-voltage level shifter configured to receive an enable signal during the erase operation and convert a level of the enable signal. The pass transistors are turned on in response to the level-converted enable signal.

Embodiments of the disclosure are directed to provide a nonvolatile memory device that includes a plurality of memory cells that are addressed by a bit line. Each of the memory cells is also addressed by a different one of a plurality or word lines. A voltage generating circuit generates voltages and applies the generated voltages to the word lines so as to erase data stored by the memory cells. The generated voltage applied to each word line varies in accordance with a characteristic of the memory cell addressed by the word line.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIGS. 12A to 12C are example diagrams illustrating various waveform shapes of word line erase voltages generated by the word line erase voltage generators illustrated in FIG. 10 or 11;

DETAILED DESCRIPTION

Figure 1:
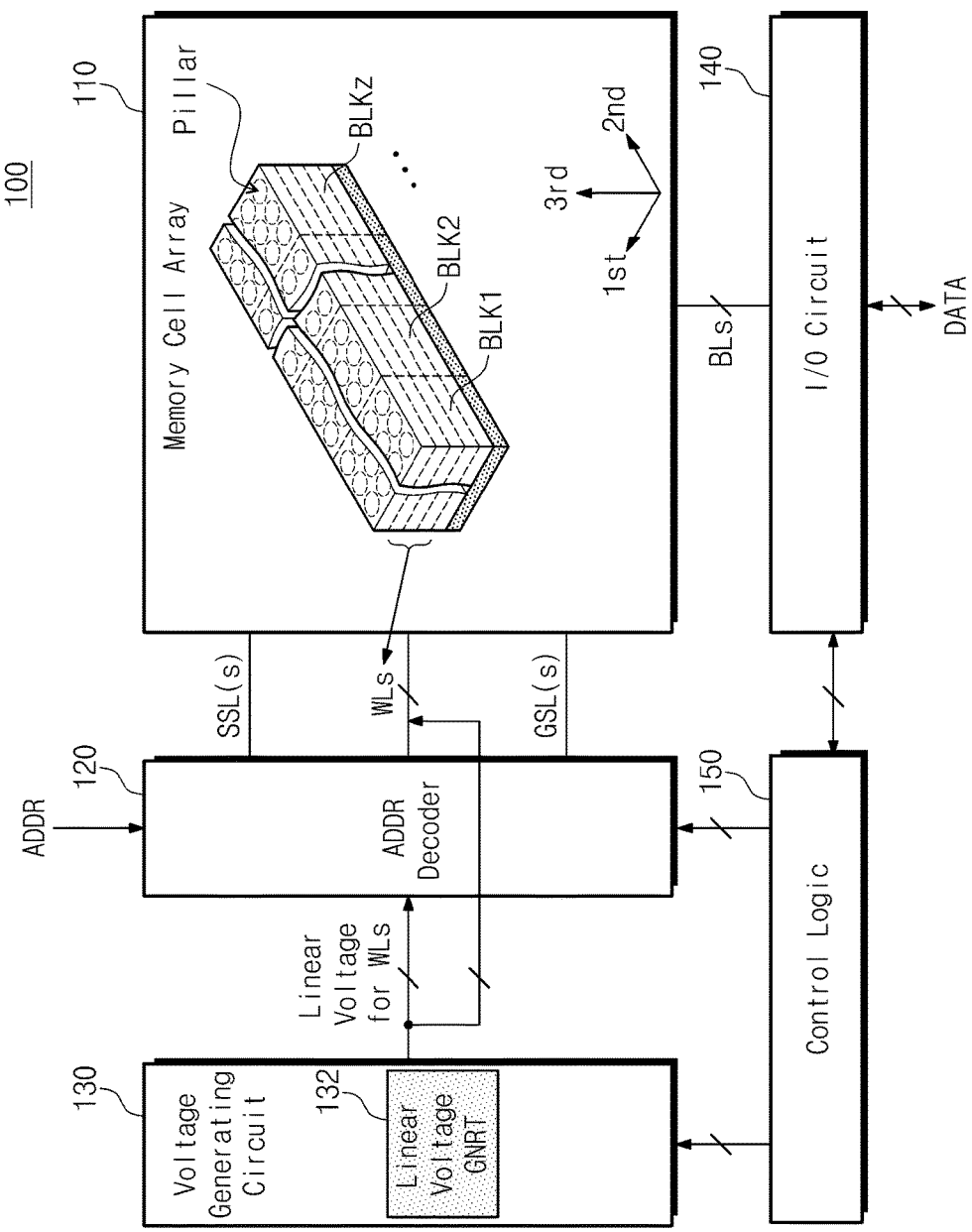
FIG. 1 is a block diagram illustrating a nonvolatile memory device according to an embodiment of the disclosure.

The present disclosure will be described more fully hereinafter with reference to the accompanying drawings, in which exemplary embodiments of the disclosure are shown.

While the disclosure is susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure. It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

FIG. 1 is a block diagram illustrating a nonvolatile memory device according to an embodiment of the disclosure. Referring to FIG. 1, a nonvolatile memory device 100 may include a memory cell array 110, an address decoder 120, a voltage generating circuit 130, an input/output (I/O) circuit 140, and a control logic 150.

The nonvolatile memory device 100 may be a NAND flash memory, a vertical NAND flash memory (VNAND), a NOR flash memory, a resistive random access memory (RRAM), a phase-change memory (PRAM), a magneto-resistive random access memory (MRAM), a ferroelectric random access memory (FRAM), a spin transfer toque random access memory (STT-RAM), or the like.

Moreover, the nonvolatile memory device may be implemented in a three-dimensional array structure. In an embodiment of the disclosure, a three dimensional (3D) memory array may be monolithically formed in one or more physical levels of memory cell arrays having an active area disposed above a silicon substrate and circuitry associated with an operation of those memory cells. Circuitry associated with the operation of those memory cells may be located above or within the substrate. The term "monolithic" means that layers of each level of the 3D memory array are directly deposited on the layers of each underlying level of the array.

In an embodiment of the disclosure, the 3D memory array includes vertical NAND strings that are vertically oriented such that at least one memory cell is located over another memory cell. The at least one memory cell may comprise a charge trap layer. Each vertical NAND string may include at least one select transistor located over memory cells. The at least one select transistor may have the same structure as the memory cells and may be formed monolithically together with the memory cells.

The 3D memory array is configured as a plurality of levels, with word lines and/or bit lines shared between levels. The following patent documents, which are hereby incorporated by references, describe suitable configurations for three-dimensional memory arrays, which are filed by Samsung Electronics Co.: U.S. Pat. Nos. 7,679,133; 8,553,466; 8,654,587; 8,559,235; and US Pat. Pub. No. 2011/0233648. The nonvolatile memory device according to an embodiment of the disclosure may be applicable to a charge trap flash (CTF) in which an insulating layer is used as a charge storage layer, as well as a flash memory device in which a conductive floating gate is used as a charge storage layer. Below, for descriptive convenience, the nonvolatile memory device 100 may be referred to as "a vertical NAND flash memory (VNAND) device".

The memory cell array 110 may include a plurality of memory cell blocks BLK1 to BLKz (z being a natural number of 2 or more). Each of the memory blocks BLK1 to BLKz may be connected to the address decoder circuit 120 through a plurality of word lines WLs, at least one string selection line SSL(s), and at least one ground selection line GSL(s) and may be connected to the input/output circuit 140 through a plurality of bit lines BLs. In an embodiment, the plurality of word lines WLs may be a plate-type structure in which the word lines are stacked in a direction (e.g., third direction) perpendicular to a substrate.

Each of the memory blocks BLK1 to BLKz may include a plurality of cell strings. Each of the cell strings may include at least one or more pillars formed so as to form a path through the plate-shaped word lines WLs. Each of the pillars may be arranged on the substrate along a first direction and a second direction (different from the first direction) and along a third direction (i.e., a direction perpendicular to a plane formed by the first and second directions). Each of the pillars may include an insulating layer surrounding semiconductor layers in a direction perpendicular to the substrate, and a charge accumulation layer surrounding the insulating layer.

Each of the cell strings may include at least one string selection transistor, memory cells, and at least ground selection transistor serially connected between a bit line and a common source line. Each of the memory cells may be implemented with a stacked gate transistor which includes an insulating layer (or film), a charge storage layer, a control gate, and the like. In addition, each of the memory cells may store at least one bit. At least one dummy cell may be included between at least one string selection transistor and the memory cells. In addition, in an embodiment, the at least one dummy cell may be included between the memory cells and at least one ground selection transistor.

The address decoder 120 may select one of the memory blocks BLK1 to BLKz in response to an address ADDR. In addition, the address decoder 120 may be connected to the memory cell array 110 through the word lines WL, the at least one string selection line SSL, and the at least one ground selection lines GSL.

In an embodiment, the address decoder 120 may include at least one word line driver for driving word lines, a string selection driver for driving the string selection line SSL, and a ground selection line driver for driving a ground selection line GSL.

In addition, the address decoder 120 may decode a column address of the inputted addresses. In this case, the decoded column address may be transmitted to the input/output circuit 140. In an embodiment, the address decoder 120 may include, but not limited to, a row decoder, a column decoder, and an address buffer.

The voltage generating circuit 130 may be configured to generate voltages (e.g., a program voltage, a pass voltage, a read voltage, a read pass voltage, a verify voltage, an erase voltage, a word line erase voltage, a common source line voltage, a well voltage, and the like) required for an operation. The voltage generating circuit 130 may generate word line voltages for performing a program/read/erase operation. The word line voltages may include a selection word line voltage and at least one non-selection word line voltage.

In addition, the voltage generating circuit 130 may be configured to generate linear voltages to be supplied to word lines WLs. In this case, the term "linear voltages" may imply that word line voltages applied to all or a portion of the word lines linearly increase or decrease. The voltage generating circuit 130 may include at least one linear voltage generator 132 for generating the linear voltages.

The input/output circuit 140 may be connected with the memory cell array 110 through the plurality of bit lines BL. The input/output circuit 140 may be configured to receive the decoded column address from the address decoder 120. The input/output circuit 140 may select the bit lines BLs using the decoded column address.

The input/output circuit 140 may include a plurality of page buffers which store data to be programmed during a program operation or data read during a read operation. Here, each of the plurality of page buffers may include a plurality of latches. During a program operation, data, DATA, stored in the page buffers may be programmed at a page corresponding to a selected memory block through the bit lines BLs. During a read operation, data read from a page corresponding to a selected memory block may be stored in the page buffers through the bit lines BLs and thereafter output as data, DATA. Meanwhile, the input/output circuit 140 may read data from a first region of the memory cell array 110 and may store the read data in a second region of the memory cell array 110. For example, the input/output circuit 140 may be configured to perform a copy-back operation.

The control logic 150 may be configured to control an overall operation (e.g., program/read/erase operations, etc.). The control logic 150 may operate in response to control signals or a command inputted from an external device.

In addition, to improve the reliability of the memory cell, the control logic 150 may control the voltage generating circuit 130 so as to generate an optimal word line voltage. For example, the control logic 150 may control the voltage generating circuit 130 so as to generate the linear voltages for improving the reliability of the memory cell based on information provided from the external device. In another embodiment, the control logic 150 may control the voltage generating circuit 130 so as to generate the linear voltages for improving the reliability of the memory cell based on an internal determination criterion. In another embodiment, the control logic 150 may determine whether the linear voltages are optionally generated based on a variety of environment information (e.g., P/E cycles, a temperature, degradation information, an ECC error count, power consumption, etc.). That is, the control logic 150 may determine whether a linear voltage generator 132 is activated based on the environment information. In another embodiment, the control logic 150 may control the linear voltage generator 132 so as to generate the linear voltages regardless of the environment information. The above-described control logic 150 may be an example, and the scope and spirit of the disclosure may not be limited thereto.

The nonvolatile memory device 100 according to an embodiment of the disclosure may generate linear voltages fit to structural/physical characteristics and may apply the generated linear voltages to word lines, thereby improving the reliability of the memory cell greatly.

Figure 2:
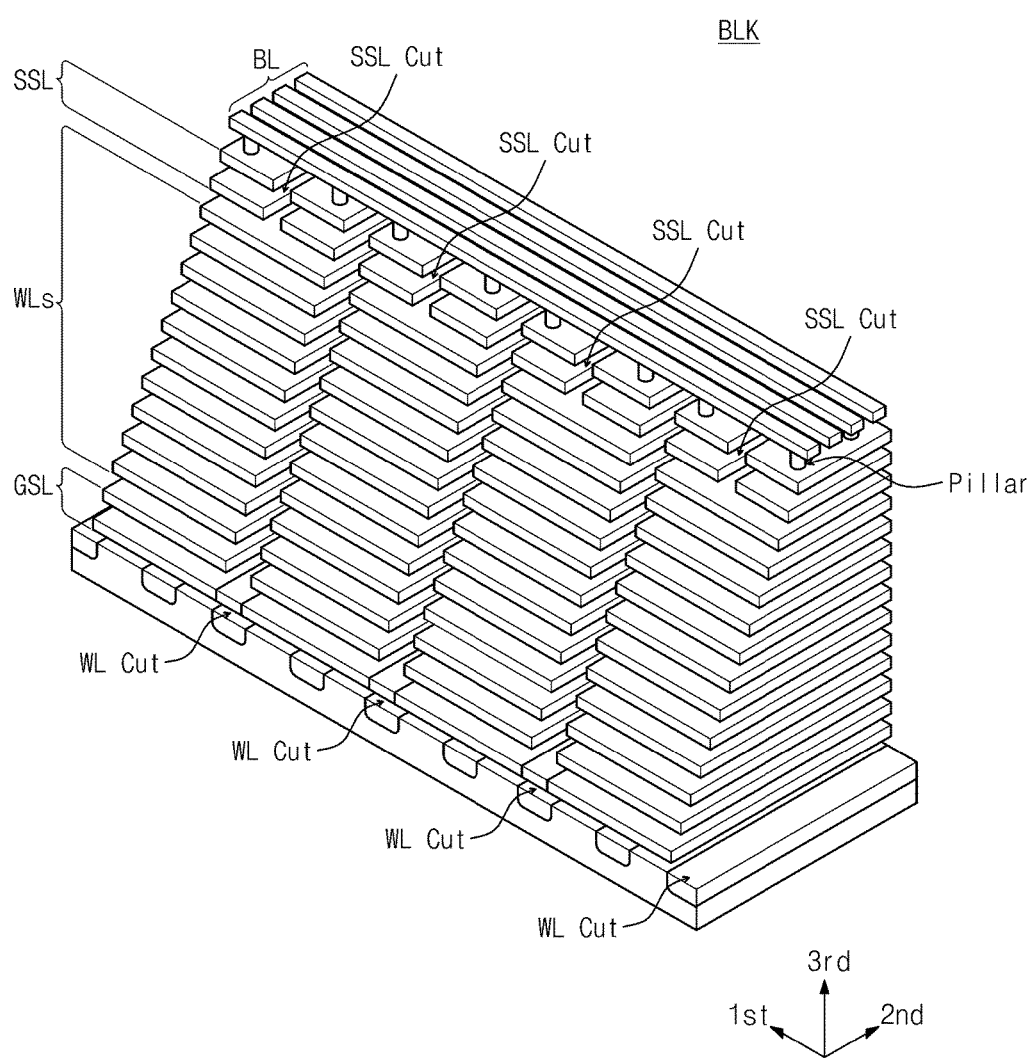
FIG. 2 is a diagram illustrating a memory block FIG. 1 according to an embodiment of the disclosure.

FIG. 2 is a diagram illustrating a block BLK of a memory cell according to an embodiment of the disclosure. Referring to FIG. 2, four sub-blocks on the substrate are illustrated. The sub-blocks may be formed by stacking at least one ground selection line GSL, a plurality of word lines WLs, and at least one string selection line SSL in the form of a plate on the substrate and cutting them such that word line cuts WL Cut are formed. Here, the at least one string selection line SSL may be divided by a string cut SSL Cut.

Meanwhile, the string cut SSL Cut by which string selection lines are divided may exist in a block BLK shown in FIG. 2. However, the scope and spirit of the disclosure may not be limited thereto. For example, a block according to an embodiment of the disclosure may be formed to have a structure including a plurality of string selection lines which are not cut by the string cut SSL Cut.

In an embodiment, at least one dummy word line may be stacked in the form of a plate between a ground selection line GSL and word lines WLs, or at least one dummy word line may be stacked in the form of a plate between the word lines WLs and a string selection line SSL.

Each of the word line cuts WL Cut may include a common source line CSL, although not illustrated. In the embodiment, the common source lines CSL respectively included in the word line cuts WL Cut may be connected in common to each other. A string may be formed by making a pillar, Pillar, connected to the bit line BL penetrate at least one ground selection line GSL, a plurality of word lines WLs, and at least one string selection line SSL.

In FIG. 2, a structure between word line cuts WL Cut may be illustrated as being a sub block. However, the scope and spirit of the disclosure may not be limited thereto. For example, according to an embodiment of the disclosure, a structure between the word line cut WL Cut and the string selection line cut SSL Cut may be named a sub-block.

A block BLK according to an embodiment of the disclosure may be configured to have a structure in which two word lines are merged into one word line, for example, a merged word line structure. The above-described memory block BLK may be an example, and the scope and spirit of the disclosure may not be limited thereto.

Figure 3:
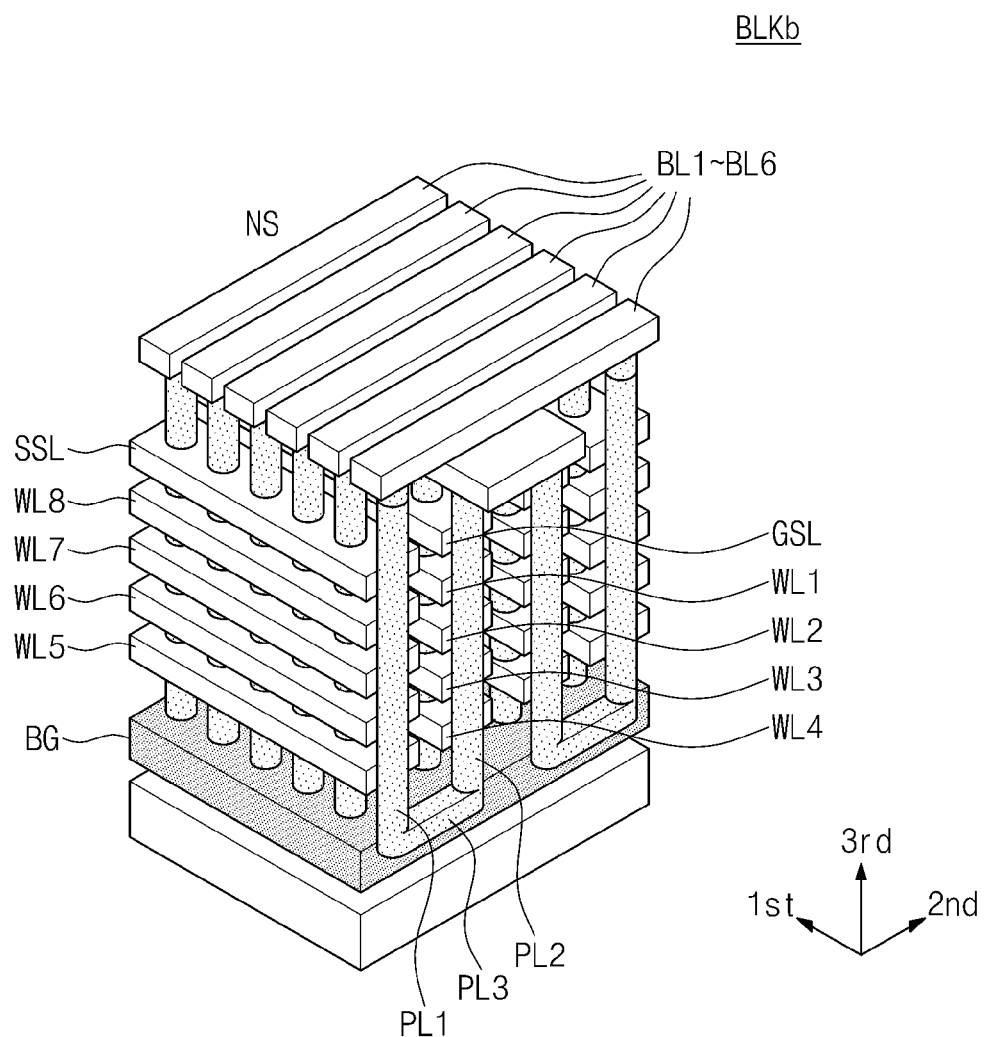
FIG. 3 is a diagram illustrating a memory block according to an embodiment of the disclosure.

FIG. 3 is a diagram illustrating a memory block BLKb according to an embodiment of the disclosure. Referring to FIG. 3, for descriptive convenience, an embodiment of the disclosure is exemplified with the number of word line layers in a memory block BLKb being four. The memory block BLKb may be implemented in a pipe-shaped bit cost scalable (PBiCS) structure in which lower ends of adjacent memory cells serially connected are connected to each other through a pipe. The memory block BLKb may include strings NS of m×n (m and n being a natural number).

In FIG. 3, an embodiment of the disclosure is exemplified as m=6 and n=2. Each string NS may include memory cells MC1 to MC8 serially connected. Here, a first upper end of the memory cells MC1 to MC 8 may be connected to a string selection transistor SST, and a second upper end of the memory cells MC1 to MC8 may be connected to a ground selection transistor GST. Lower ends of the memory cells MC1 to MC8 may be connected through the pipe.

Memory cells constituting the string NS may be formed as a plurality of semiconductor layers that are stacked on each other. Each string NS may include a first pillar PL1, a second pillar PL2, and a pillar connection part PL3 connecting the first pillar PL1 and the second pillar PL2. The first pillar PL1 may be connected to a bit line (e.g., BL1) and the pillar connection part PL3 and may be formed so penetrate a string selection line SSL and word lines WL5 to WL8. The second pillar PL2 may be connected to a common source line CSL and the pillar connection part PL3 and may be formed to penetrate a ground selection line GSL and word lines WL1 to WL4. As described in FIG. 3, the string NS may be implemented in the form of a U-shaped pillar.

In an embodiment, a back-gate BG may be formed on the substrate, and the pillar connection part PL3 may be formed in the back gate BG. In an embodiment, the back-gate BG may be formed to be used in common within the memory block BLKb. The back-gate BG of one block may be separated from a back-gate of another block.

Figure 4:
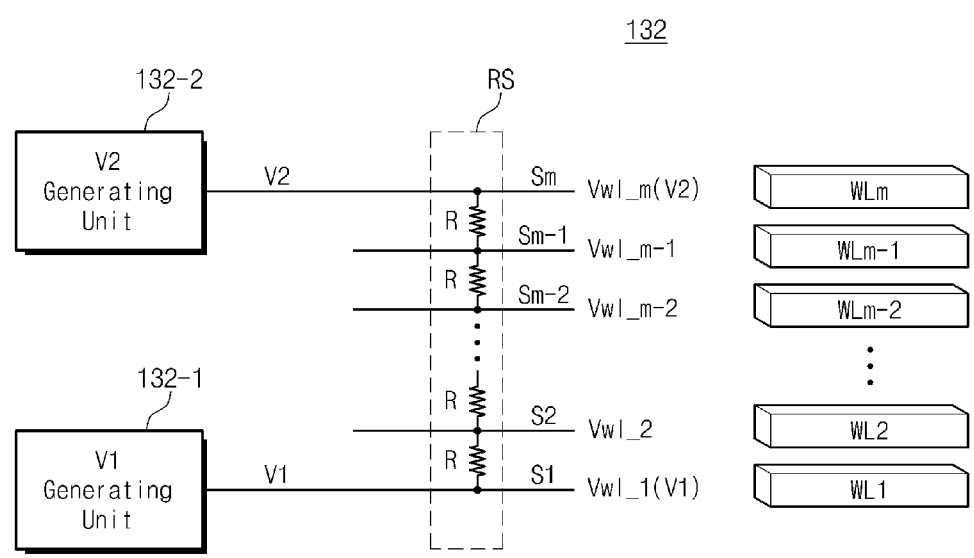
FIG. 4 is a diagram illustrating a linear voltage generator according to an embodiment of the disclosure.

FIG. 4 is a diagram illustrating a linear voltage generator according to an embodiment of the disclosure. Referring to FIG. 4, a linear voltage generator 132 may include a first voltage generating unit 132-1, a second voltage generating unit 132-2, a plurality of voltage source lines S1 to Sm (m being an integer of 3 or more), and a resistor string RS connected between the voltage source lines S1 to Sm. As illustrated in FIG. FIG. 4, the voltage source lines S1 to Sm may correspond to word lines WL1 to WLm, respectively.

The first voltage generating unit 132-1 may generate a first voltage V1 and may provide the generated first voltage V1 to a first voltage source line S1.

The second voltage generating unit 132-2 may generate a second voltage V2 and may provide the generated second voltage V2 to an m-th voltage source line Sm. In this case, the second voltage V2 may be greater than or smaller than the first voltage V1.

The first voltage source line S1 may be electrically connected to the first voltage generating unit 132-1. The first voltage source line S1 may have a first word line voltage Vwl_1. The second voltage source line S2 may be electrically connected to the first voltage source line S1 through a resistor R. As described above, an (m−1)-th voltage source line Sm−1 may be electrically connected to each of the m-th voltage source line Sm and an (m−2n)-th voltage source line Sm−2. Thus, voltage source lines S1 to Sm may respectively have voltages, which linearly increase or decrease, for example, linear word line voltages Vwl_1 to Vwl_m by dividing a voltage between the first voltage V1 and the second voltage V2 using the resistor string RS.

All the WL voltage levels may vary individually depending on the inputs of the voltage generating units 132-1, 132-2 as shown in FIG. 4.

Meanwhile, the linear voltage generator 132 illustrated in FIG. 4 is an example, and the scope and spirit of the disclosure may not be limited thereto.

Figure 5:
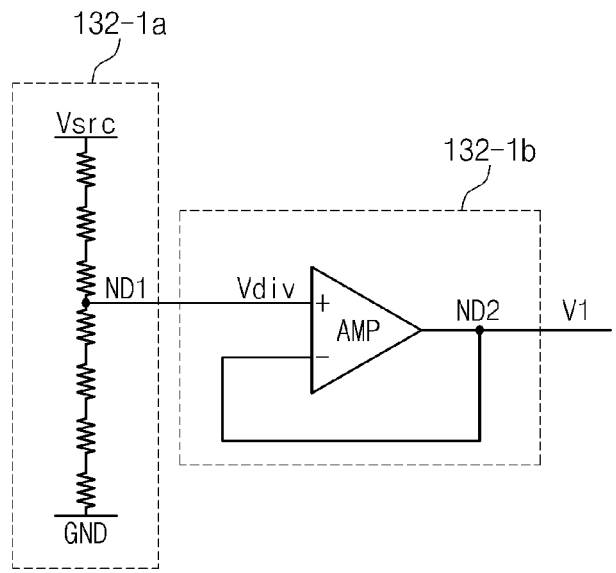
FIG. 5 is a diagram illustrating a first voltage generating unit described in FIG. 4 according to an embodiment of the disclosure.

FIG. 5 is a diagram illustrating a first voltage generating unit 132-1 described in FIG. 4. Referring to FIG. 5, the first voltage generating unit 132-1 may include a resistor string 132-1a and a voltage follower 132-1b.

The resistor string 132-1a may include a plurality of resistors serially connected between a power supply terminal Vsrc and a ground terminal GND. Here, a source voltage may be provided to the power supply terminal Vsrc. Meanwhile, the voltage generating circuit 130 (refer to FIG. 1) may further include a source voltage generator for generating a source voltage. The source voltage may be generated using a variety of methods such as a voltage distribution or a charge pump performed with respect to an internal/external voltage. In an embodiment, the resistor string 132-1a may be implemented with a variable resistor. A distribution voltage Vdiv of a node ND1 between plural resistors may be used as the first voltage V1.

The voltage follower 132-1b may include an amplifier AMP which compares the distribution voltage Vdiv applied to a first terminal (+) with a voltage of a second terminal (−) to which an output node ND2 is connected. The amplifier AMP may output the first voltage V1 to an output node ND2.

Meanwhile, the first voltage generating unit 132-1 illustrated in FIG. 4 is an example, and the scope and spirit of the disclosure may not be limited thereto. For example, the voltage follower 132-1b may be omitted in some cases.

On the other hand, the second voltage generating unit 132-2 illustrated in FIG. 4 may be implemented in a structure similar to the first voltage generating unit 132-1 illustrated in FIG. 4.

Figure 6:
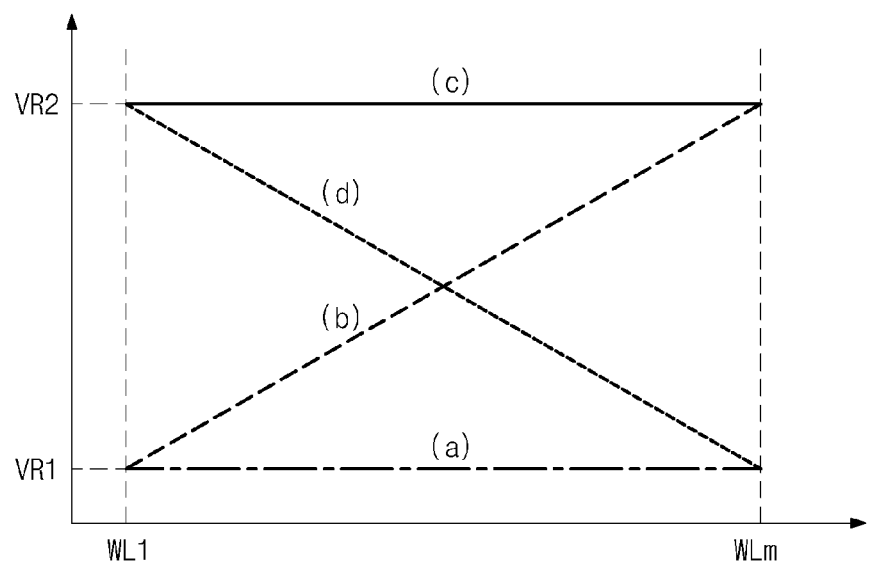
FIG. 6 is a diagram illustrating a linear voltage generation waveform outputted from a linear voltage generator according to an embodiment of the disclosure.

FIG. 6 is a diagram illustrating a generation waveform of a linear voltage outputted from a linear voltage generator 132 according to an embodiment of the disclosure. Referring to FIG. 6, a voltage generation waveform of the linear voltage generator 132 may be classified into the following four types based on positions of the word lines WL1 to WLm: a first voltage waveform (a), a second voltage waveform (b) which increases from a first voltage level VR1 to a second voltage level VR2, a third voltage waveform (c) which maintains the second voltage level VR2, and a fourth voltage waveform (d) which decreases from the second voltage level VR2 to the first voltage level VR1.

In an embodiment, a voltage generation waveform of the linear voltage generator 132 may be determined based on a word line position. In another embodiment, a voltage generation waveform of the linear voltage generator 132 may be determined based on a memory block position. In still another embodiment, a voltage generation waveform of the linear voltage generator 132 may be determined based on environmental information (e.g., temperature, noise, etc.).

Meanwhile, the linear voltage generator 132 illustrated in FIG. 4 may include two voltage generating units 131-1 and 131-2. However, the scope and spirit of the disclosure may not be limited thereto. For example, a linear voltage generator according to an embodiment of the disclosure may be configured to include three or more voltage generating units.

Figure 7:
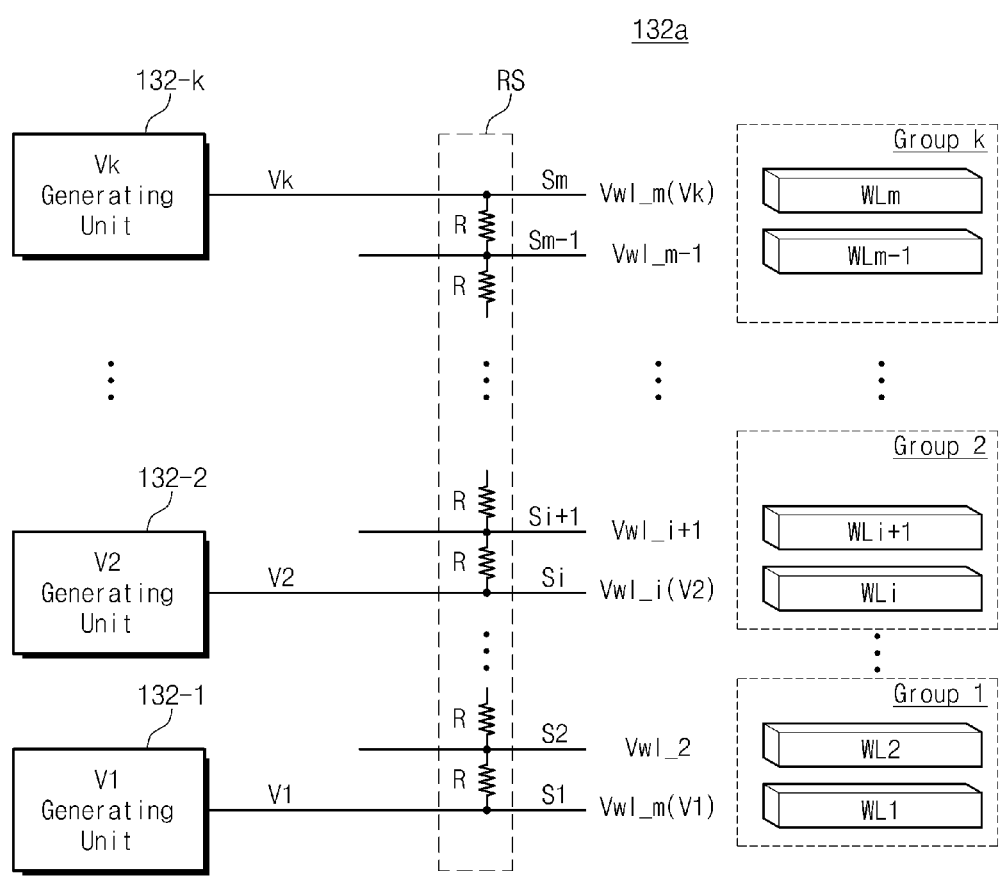
FIG. 7 is a diagram illustrating a linear voltage generator according to another embodiment of the disclosure.

FIG. 7 is a diagram illustrating a linear voltage generator according to another embodiment of the disclosure. Referring to FIG. 7, a linear voltage generator 132a may be different from the linear voltage generator 132 described in FIG. 4 in that three or more voltage generating units 132-1 to 132-k (k being a natural number) are included therein.

A first voltage generating unit 132-1 may be coupled to a first voltage source line S1 and may be configured to output a first voltage V1. A second voltage generating unit 132-2 may be connected to an i-th voltage source line Si (i being an integer greater than or equal to 3) and may be configured to output a second voltage V2. Likewise, a k-th voltage generating unit 132-k (k being an integer greater than or equal to 3) may be connected to an m-th voltage source line Sm and may be configured to output a k-th voltage Vk.

As illustrated in FIG. 7, the voltage generating units 132-1 to 132-k respectively corresponding to word line groups Group 1 to Group k may exist. As 3 or more voltage generating units 132-1 to 132-k exist, the degree of freedom about the linear word line voltages Vwl_1 to Vwl_m to be generated may increase.

Meanwhile, a linear voltage generator according to an embodiment of the disclosure may be configured to selectively activate the voltage generation units 131-1 to 132-k.

Figure 8:
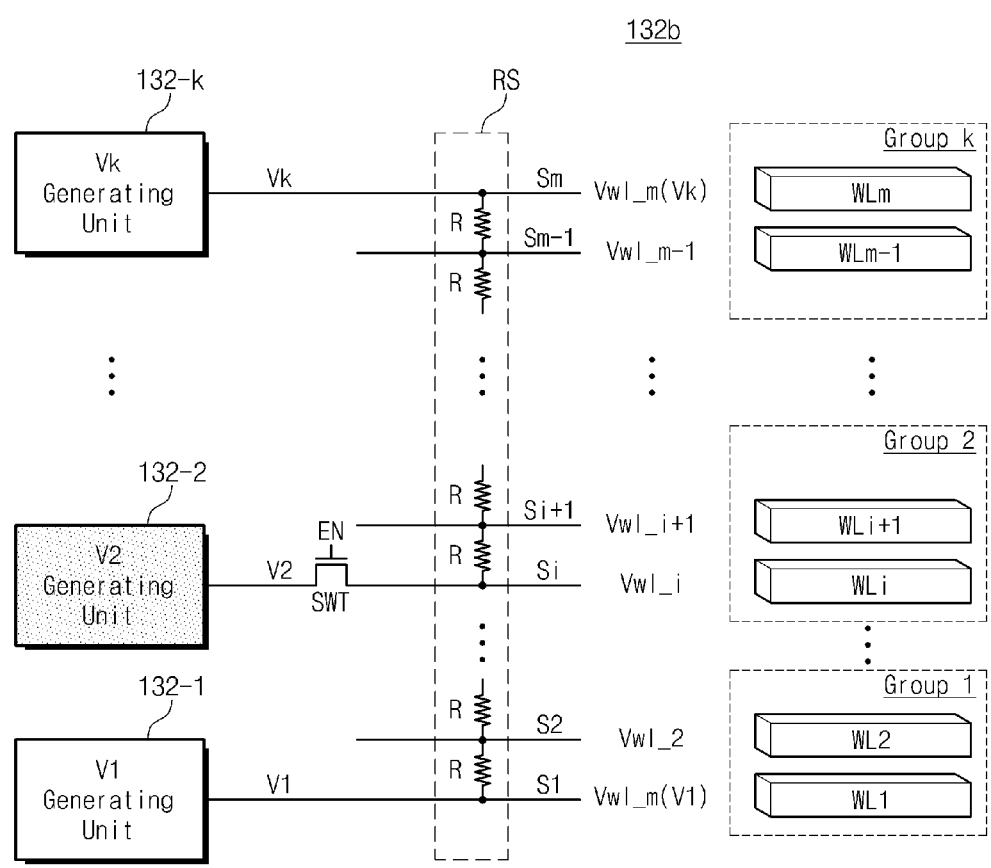
FIG. 8 is a diagram illustrating a linear voltage generator according to another embodiment of the disclosure.

FIG. 8 is a diagram illustrating a linear voltage generator according to another embodiment of the disclosure. Referring to FIG. 8, compared with the linear voltage generator 132a described in FIG. 7, a linear voltage generator 132b may be configured to selectively activate a second voltage generating unit 132-2. A second voltage V2 outputted from the second voltage generating unit 132-2 may be connected to an i-th voltage source line Si as a transistor SWT is turned on. That is, the second generating unit 132-2 may be electrically connected to the i-th voltage source line Si in response to an enable signal EN.

On the other hand, for descriptive convenience, an embodiment of the disclosure is exemplified in FIG. 8 as only the second voltage generating unit 132-2 is connected to the voltage source line Si based on a switching operation. However, the scope and spirit of the disclosure may not be limited thereto. For example, the linear voltage generator 132b according to an embodiment of the disclosure may be configured to selectively connect at least one of the voltage generating units 131-1 to 132-k to a corresponding voltage source line.

Meanwhile, the linear voltage generator 132b illustrated in FIG. 8 is an example, and the scope and spirit of the disclosure may not be limited thereto.

Meanwhile, the linear voltage generator 132b illustrated in FIG. 8 may be implemented such that one voltage generating unit 132-2 is connected to one voltage source line Si through a switching operation. However, the scope and spirit of the disclosure may not be limited thereto. For example, a linear voltage generator according to an embodiment of the disclosure may be implemented such that one voltage generating unit is electrically connected to a plurality of voltage source lines through a plurality of switching operations.

Figure 9:
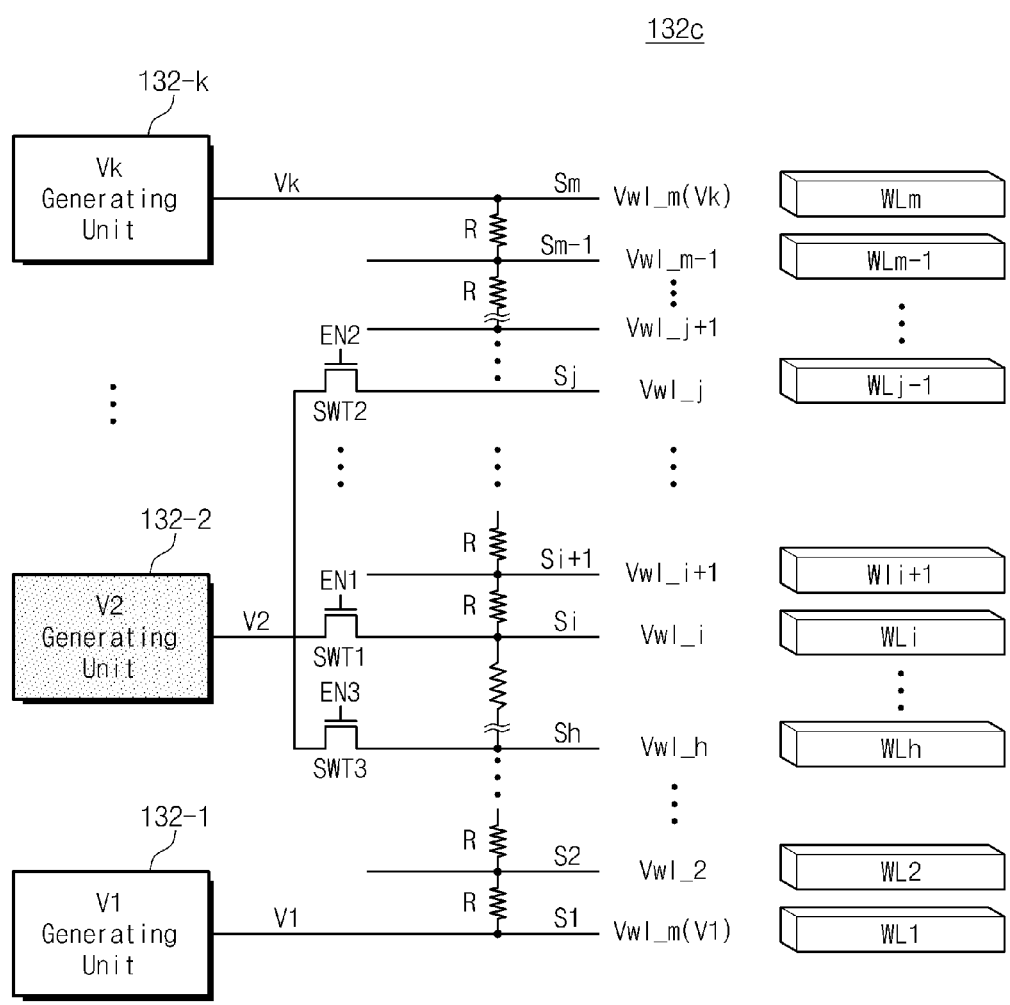
FIG. 9 is a diagram illustrating a linear voltage generator according to another embodiment of the disclosure.

FIG. 9 is a diagram illustrating a linear voltage generator 132c according to another embodiment of the disclosure. Referring to FIG. 9, compared with the linear voltage generator 132b illustrated in FIG. 8, a linear voltage generator 132c may include the second generating unit 132-2 electrically connected to a plurality of voltage source lines Si, Sj, and Sh through a plurality of switching operations. In this case, the plurality of switching operations may be performed by turn-on/off operations of transistors SWT1 to SWT3 between an output terminal of the second voltage generating unit 132-2 and corresponding voltage source lines Si, Sj, and Sh. The turn-on/off operations of the transistor transistors SWT1 to SWT3 may be performed in response to enable signals EN1 to EN3.

The linear voltage generator 132c described in FIG. 9 may determine whether one voltage generating unit 132-2 is connected to the corresponding voltage source lines Si, Sj, and Sh through switching operations of the three transistors SWT1 to SWT3. However, a linear voltage generator according to an embodiment of the disclosure may be implemented such that one voltage generating unit is electrically connected to two or more voltage source lines through two or more switching operations. Meanwhile, the linear voltage generator 132c illustrated in FIG. 9 is an example, and the scope and spirit of the disclosure may not be limited thereto.

Meanwhile, a linear voltage generator according to an embodiment of the disclosure may be applied to a word line erase voltage generator used for an erase operation.

Figure 10:
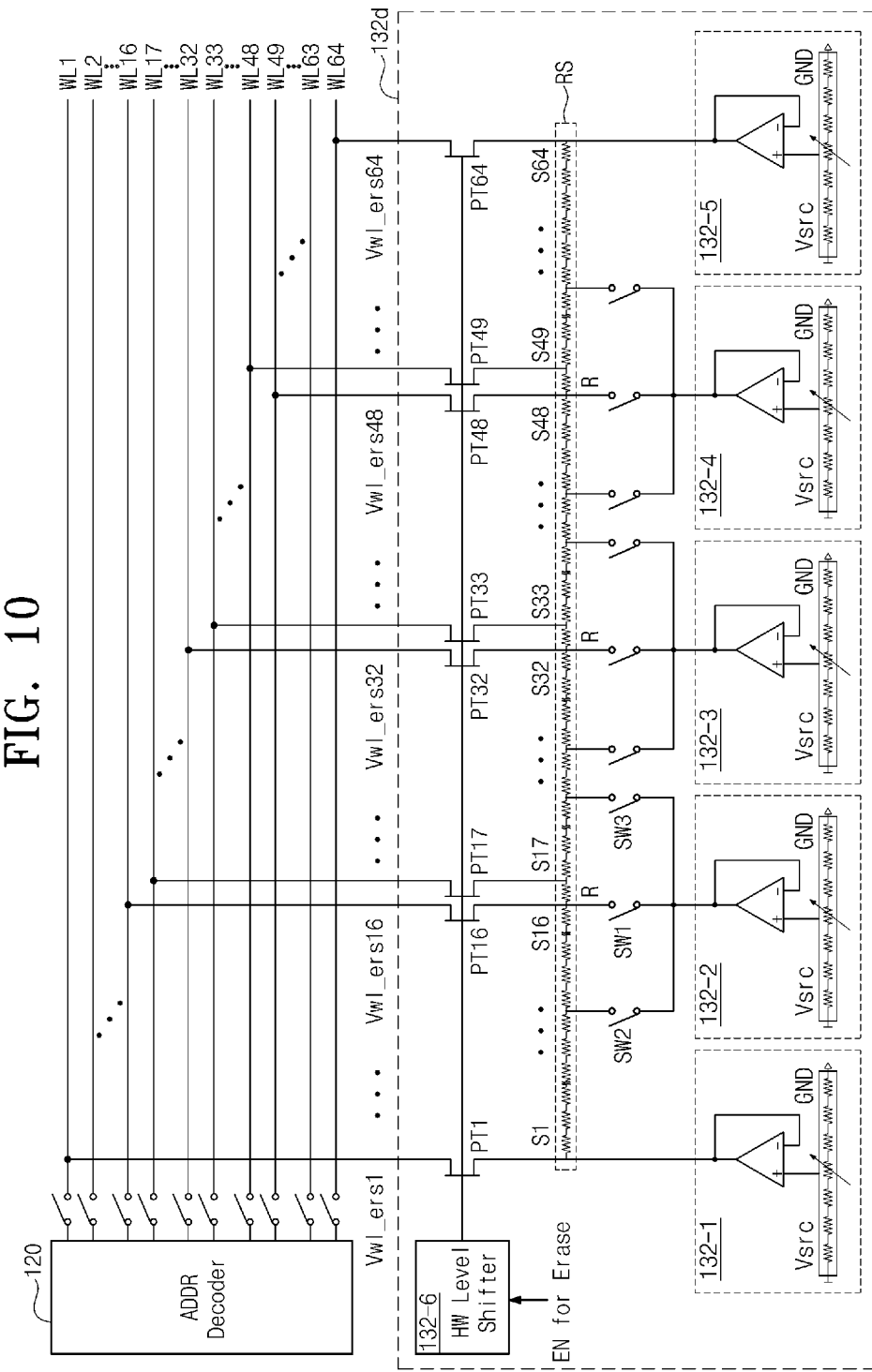
FIG. 10 is a diagram illustrating a word line erase voltage generator according to an embodiment of the disclosure.

FIG. 10 is a diagram illustrating a word line erase voltage generator according to an embodiment of the disclosure. Referring to FIG. 10, a word line erase voltage generator 132d may include a plurality of voltage generating units 132-1 to 132-5, a high-voltage level shifter 132-6, pass transistors PT1 to PT64, switches SW1 to SW3, resistors R, and voltage source lines S1 to S64. In FIG. 10, for descriptive convenience, word line erase voltages Vwl_ers1 to Vwl_ers64 provided to 64 word lines WL1 to WL64 are illustrated. However, the number of word lines/the number of the word line erase voltages according to an embodiment of the disclosure may not be limited thereto.

Each of the voltage generating units 132-1 to 132-5 may be implemented in a voltage generating unit as described in FIGS. 4 to 9. Each of second to fourth voltage generating units 132-2 to 132-4 may be configured to connect corresponding source lines through a plurality of switches SW1 to SW3. The voltage generating units 132-1 to 132-5 are described with reference to FIG. 9, and a detailed description thereof is thus omitted. Meanwhile, the voltage generating units 132-1 to 132-5 are examples, and the scope and spirit of the disclosure may not be limited thereto.

The high-voltage level shifter 132-6 may receive an enable signal EN to perform an erase operation and may convert the received enable signal EN into a high-voltage level signal. The pass transistors PT1 to PT64 may be electrically connected to the voltage source lines S1 to S64 and the word lines WL1 to WL64 in response to the high-voltage level signal. In an embodiment, each of the pass transistors PT1 to PT64 may be implemented in a transistor for a high-voltage.

Meanwhile, the word line erase voltage generator 132d illustrated in FIG. 10 may include a high-voltage level shifter 132-6. However, the scope and spirit of the disclosure may not be limited thereto. An erase voltage generator according to an embodiment of the disclosure may be configured to have a structure in which a high-voltage level shifter configuration is omitted.

Meanwhile, the word line erase voltage generator 132d illustrated in FIG. 10 may be directly connected to the word lines WL1 to WL64 without passing through the address decoder 120 (refer to FIG. 1). However, the scope and spirit of the disclosure may not be limited thereto. A word line erase voltage generator according to an embodiment of the disclosure may be connected to the word lines WL1 to WL64 via the address decoder 120.

Referring to FIG. 10, the total number of the word lines WL1~WL64 are partitioned into four groups based on the erase pattern distribution. The voltage generating units 132-1~132-5 are placed at the start and end of each partition. And the position of the voltage generating units 132-1~132-5 can be flexibly varied depending on the approximate linear partition ends. This can generate the WL voltages which are varying linearly from across the partition with different slopes. Here are different characteristics depending on the voltage generating units 132-1~132-5's output level and the voltage generating units 132-1~132-5's position. An address decoder 120 may be configured to connect to the word lines WL1~WL64. The address decoder 120 is the switch block in the nonvolatile memory device 100 that transfers the required voltages for the core of the nonvolatile memory device 100. During an erase mode, the address decoder 120 may disconnect all other voltages, such that the word line erase voltage generator 132*d* may output voltages that are directly applied to the word lines WL1~WL64.

Figure 11:
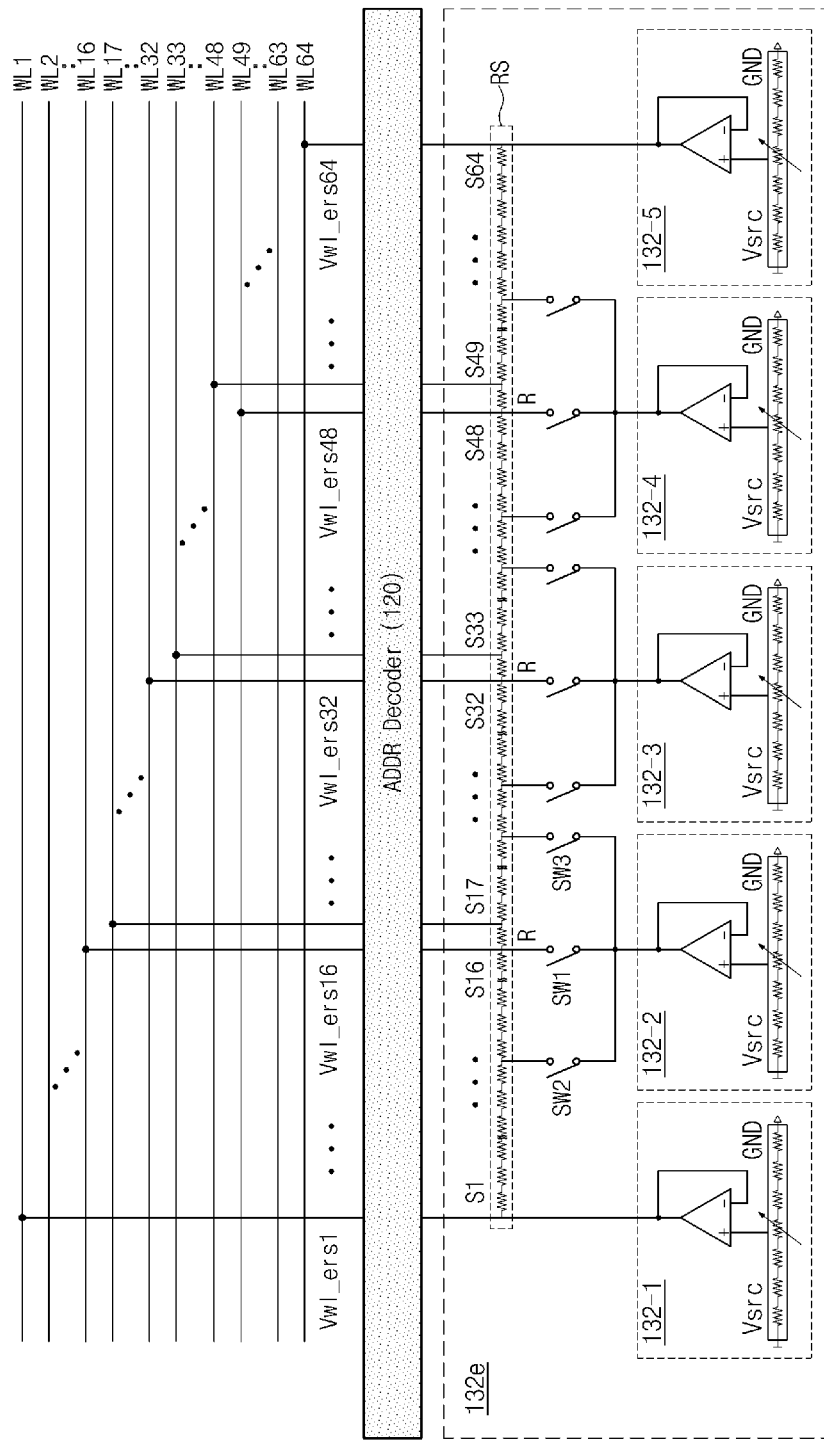
FIG. 11 is a diagram illustrating a word line erase voltage generator according to another embodiment of the disclosure.

FIG. 11 is a diagram illustrating a word line erase voltage generator according to another embodiment of the disclosure. Referring to FIG. 11, a word line erase voltage generator 132*e* may use the address decoder 120 instead of components (e.g., the high-voltage level shifter 132-6 and the pass transistors PT1 to PT64) to connect the word lines WL1 to WL64 to the voltage source lines S1 to S64.

FIGS. 12A to 12C are diagrams illustrating various waveform shapes of word line erase voltages generated by word line erase voltage generators 132*d* and 132*e* illustrated in FIG. 10 or 11.

Referring to FIG. 12A, word line erase voltages may be maintained/increased/decreased in a first interval LP1. Referring to FIG. 12B, word line erase voltages applied to word lines adjacent to a first word line WL1 relatively suddenly increase/decrease in a second interval LP2, and word line erase voltages applied to word lines placed at a central portion may normally increase/decrease in the first interval LP1. Word line erase voltages applied to word lines adjacent to the first word line WL1 relatively slowly increase/decrease in a third interval LP3. Word line erase voltages of FIG. 12C may be opposite to the word line erase voltages of FIG. 12B.

Meanwhile, waveforms of the word line erase voltages described in FIGS. 12A to 12C may be examples, and the scope and spirit of the disclosure may not be limited thereto.

FIGS. 13 to 16 are diagrams illustrating effects obtained when word line erase voltage generators 132*d*, 132*e* are used, according to embodiments of the disclosure. A memory cell in which a program operation is to be performed may have one of an erase state E and a plurality of program states P1 to P3. Meanwhile, an embodiment of the disclosure is exemplified in which the number of the program states P1 to P3 is three. However, the scope and spirit of the disclosure may not be limited thereto. For descriptive convenience, it may be assumed that memory cells include a fast cell quickly erased and a slow cell slowly erased.

Figure 13:
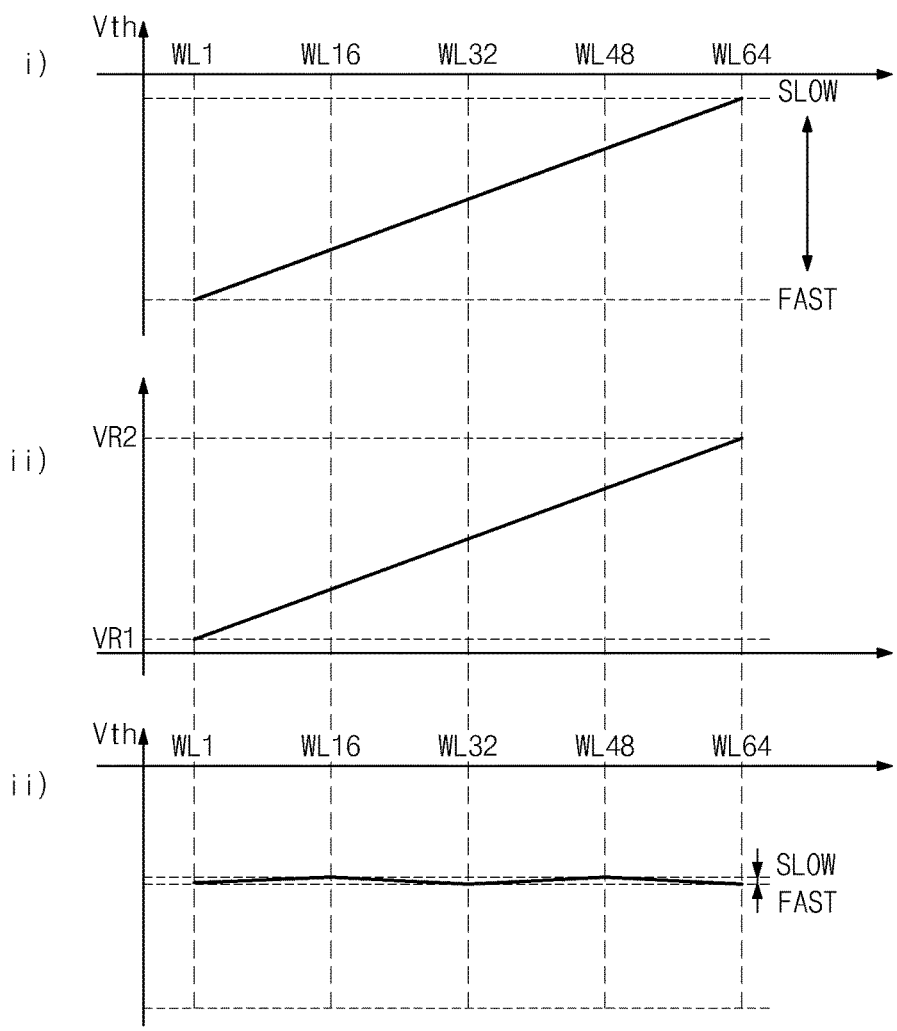
FIGS. 13 to 16 are diagrams illustrating effects based on using the word line erase voltage generators according to an embodiment of the disclosure.

Referring to FIG. 13, a memory device according to an embodiment of the disclosure may have a cell characteristic where an erase speed about WL1 to WL64 gradually decreases as a distance from the word line WL1 gradually increases (i). Thus, during an erase operation, the word line erase voltages which gradually increase as a distance from a word line gradually increases may be applied to the word lines WL1 to WL64 (ii). A waveform of the word line erase voltage may be similar to a cell characteristic waveform. Thus, after an erase operation is performed, a threshold voltage distribution corresponding to an erase state of the fast cells may be similar to a threshold voltage distribution corresponding to an erase state of the slow cells (iii).

Figure 14:
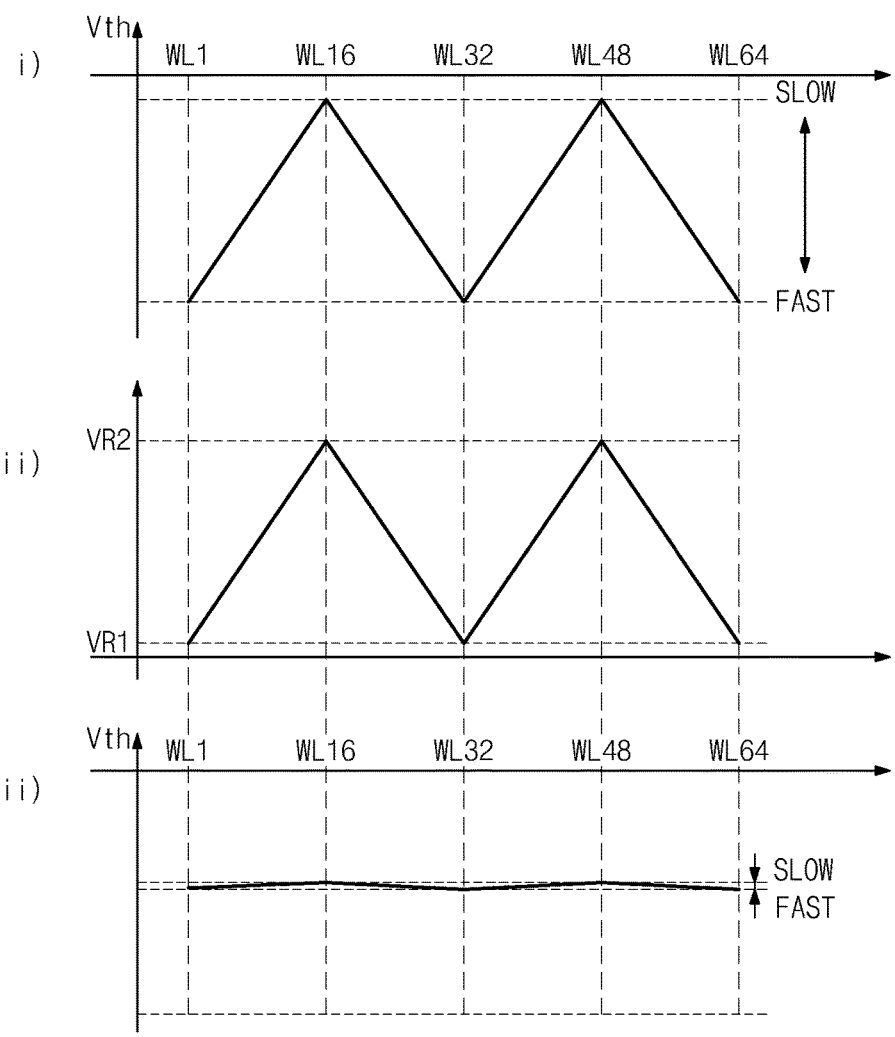

Referring to FIG. 14, a memory device according to an embodiment of the disclosure may have the following cell characteristics: an erase speed about the word lines WL1 to WL16 gradually decreases as a distance from the first word line WL1 gradually increases, an erase speed about the word lines WL17 to WL32 gradually increases as a distance from the word line WL17 gradually increases, an erase speed about the word lines WL33 to WL48 gradually decreases as a distance from the word line WL33 gradually increases, and an erase speed about the word lines WL49 to WL64 gradually increases as a distance from the word line WL49 gradually increases (i). During an erase operation, a waveform of a word line erase voltage may be also applied similar to that of a cell characteristic (ii). In this case, after an erase operation is performed, a threshold voltage distribution corresponding to an erase state of the fast cells may be similar to a threshold voltage distribution corresponding to an erase state of the slow cells (iii).

Figure 15:
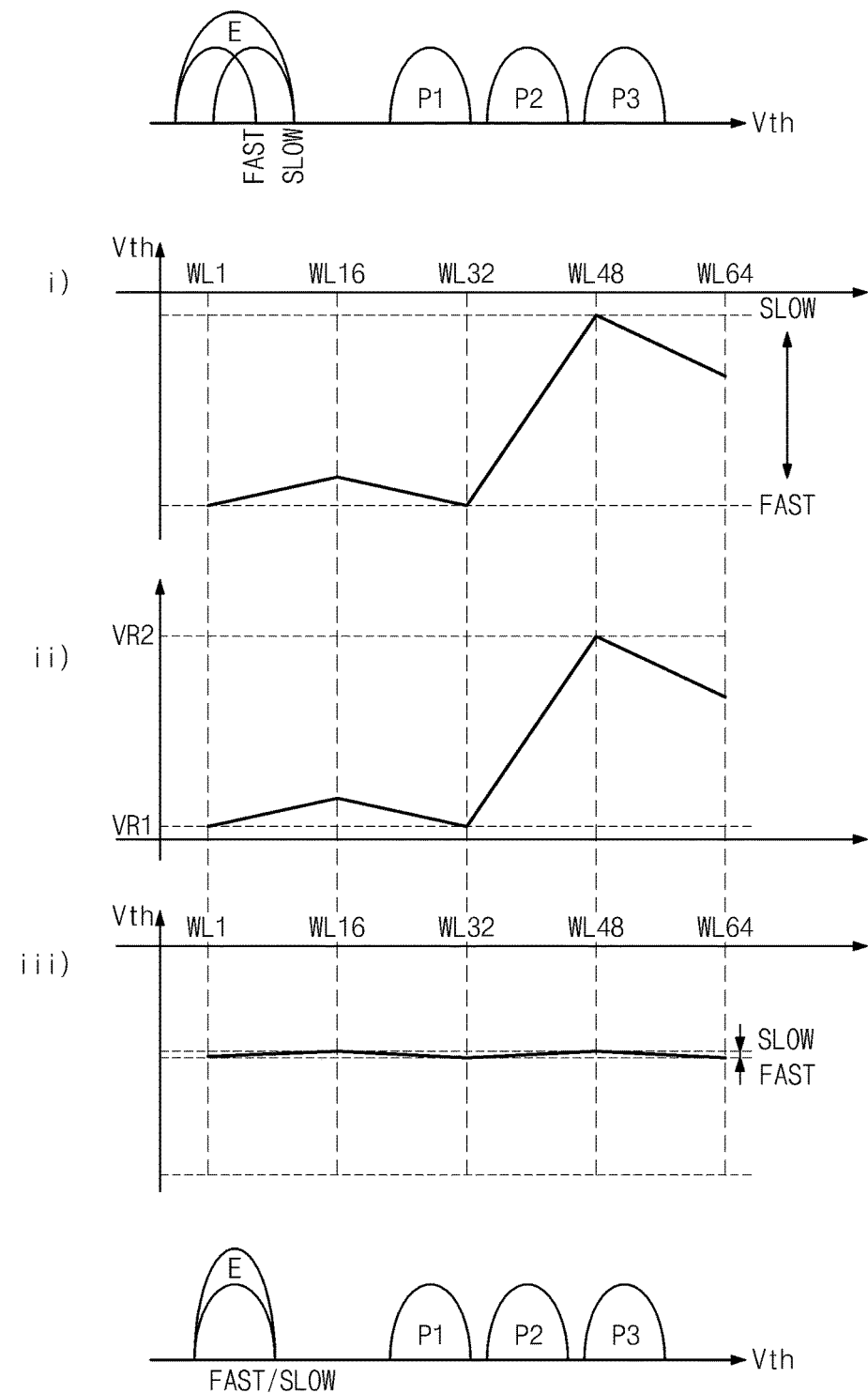

Referring to FIG. 15, according to an embodiment of the disclosure, a cell characteristic may be almost uniform even though an erase speed about the word lines WL1 to WL16 gradually decreases as a distance from the word line WL1 gradually increases, a cell characteristic may be almost uniform even though an erase speed about the word lines WL17 to WL32 gradually increases as a distance from the word line WL17 gradually increases, an erase speed about the word lines WL33 to WL48 may quickly decrease as a distance from the word line WL33 gradually increases, and an erase speed about the word lines WL39 to WL64 may gradually increase as a distance from the word line WL39 gradually increases, (i). During an erase operation, a waveform of a word line erase voltage may be also applied similar to that of a cell characteristic (ii). In this case, after an erase operation is performed, a threshold voltage distribution corresponding to an erase state of the fast cells may be similar to a threshold voltage distribution corresponding to an erase state of the slow cells (iii).

Figure 16:
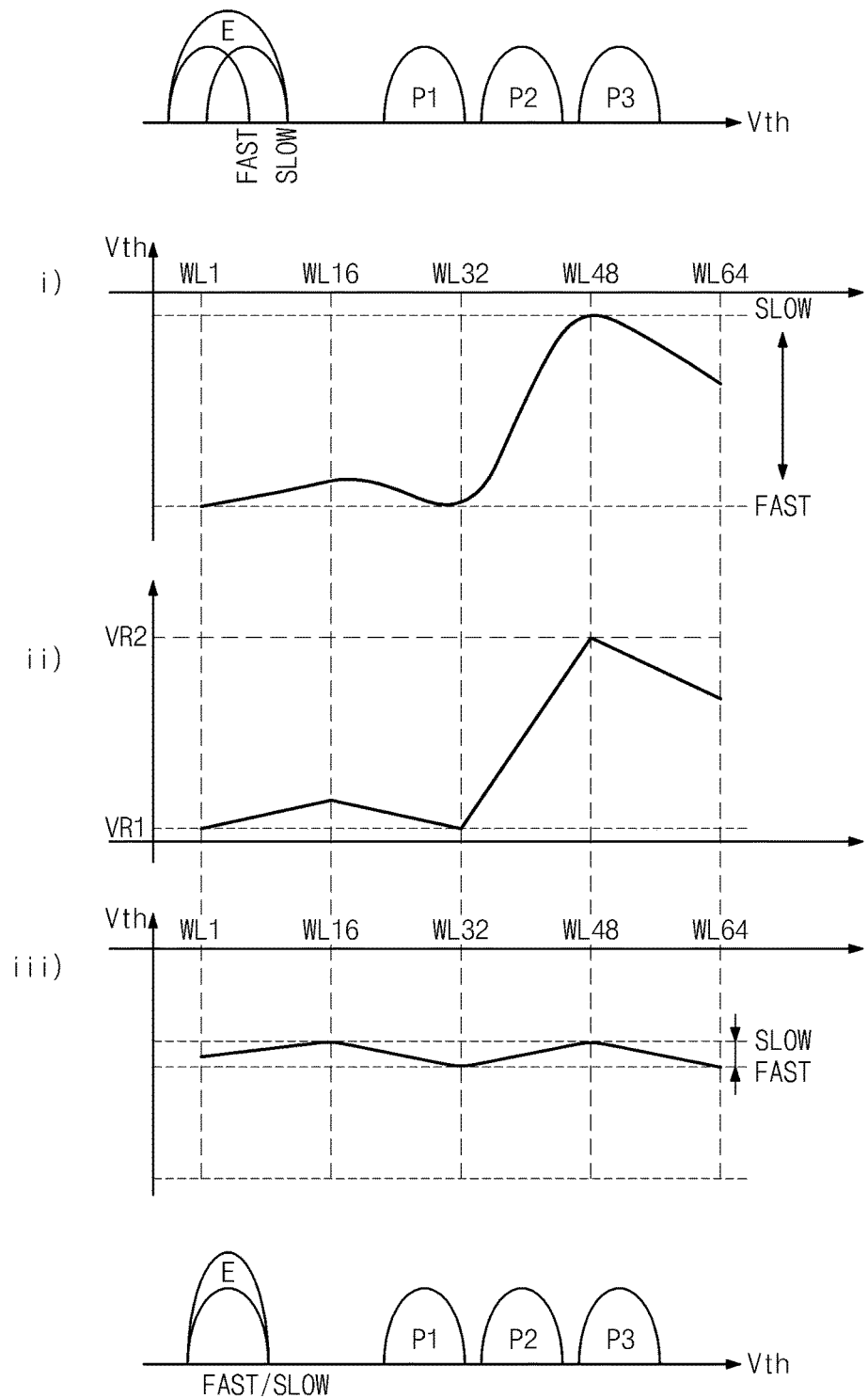

Referring to FIG. 16, a memory device according to an embodiment of the disclosure may have the following cell characteristics: an erase speed about the word lines WL1 to WL32 gradually increases as a distance from the word line WL1 gradually increases, an erase speed about the word lines WL33 to WL48 quickly decreases as a distance from the word line WL33 gradually increases, and an erase speed about the word lines WL49 to WL64 gradually increases as a distance from the word line WL49 gradually increases (i). During an erase operation, a waveform of a word line erase voltage may be also applied similar to that of a cell characteristic (ii). In this case, after an erase operation is performed, a threshold voltage distribution corresponding to an erase state of the fast cells may be similar to a threshold voltage distribution corresponding to an erase state of the slow cells (iii).

In summary, an erase operation according to an embodiment of the disclosure may apply word line erase voltages to be fit or similar to a memory cell characteristic based on a word line position, thereby minimizing a characteristic difference between a fast cell and a slow cell.

In FIG. 13 to FIG. 17, different erase patterns are considered to show the effectiveness of the word line erase voltage generator according to an embodiment of the disclosure. As it is known, during the erase operation in order to erase all the cells in a block, very high voltage is applied to the block and all WLs are connected to the same voltage level, which is '0' generally. Applying the same voltage for all the WLs during an erase mode causes non-uniform and wide erase cell Vth (threshold voltage) distribution. This limits the number of P/E cycles, reduces the first program state P1 read margin and causes increased numbers of program/verify steps. To make uniform the erase distribution, different WL voltages need to be applied in a block, which is made possible easily by the word line erase voltage generator according to an embodiment of the disclosure. The erase cell Vth distribution can be made narrow and uniform with the word line erase voltage generator according to an embodiment of the disclosure, which improves the number of PE Cycles, improves P1 read margin and reduces the number of program/verify steps.

Figure 17:
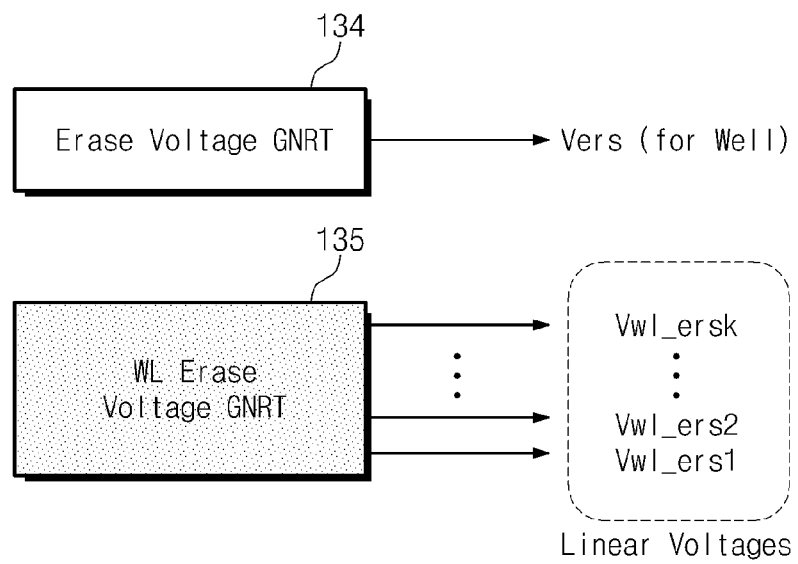
FIG. 17 is an diagram illustrating a voltage generating method required for an erase operation according to an embodiment of the disclosure.

FIG. 17 is a diagram illustrating a voltage generating method required for an erase operation according to an embodiment of the disclosure. Referring to FIG. 17, an erase voltage generator 134 may generate an erase voltage Vers to be applied to a well corresponding to a memory block, and a word line erase voltage generator 135 may generate word line erase voltages Vwl_ers1 to Vwl_ersk to be applied to word lines WLs (refer to FIG. 1) corresponding to the memory block. In this case, all or a portion of the word line erase voltages Vwl_ers1 to Vwl_ersk may linearly increase or decrease. The word line erase voltage generator 135 may be implemented with the above-described linear voltage generator.

Meanwhile, a linear voltage generator according to an embodiment of the disclosure may be also applied to a program operation or a read operation except for an erase operation.

Figure 18:
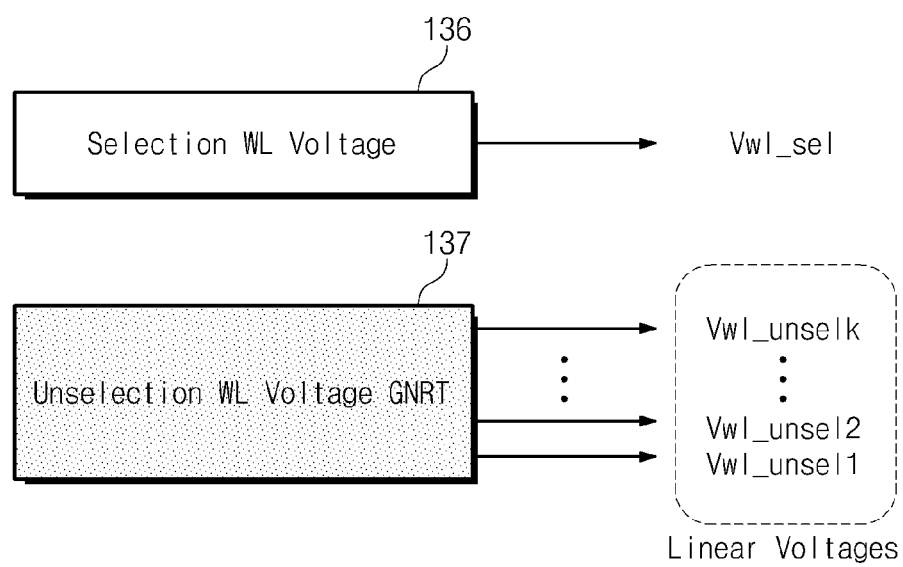
FIG. 18 is a diagram illustrating a voltage generating method required for a program/read operation according to an embodiment of the disclosure.

FIG. 18 is a diagram illustrating a voltage generating method required for a program/read operation, according to an embodiment of the disclosure. Referring to FIG. 18, a selection word line voltage generator 136 may generate a selection word line voltage Vwl_sel to be applied to a selected word line in the memory block, and an non-selection word line voltage generator 137 may generate non-selection word line voltages Vwl_unsel1 to Vwl_unselk (k being an integer greater than or equal to 3) to be applied to the unselected word lines except for the selected word line in the memory block. In this case, all or a portion of non-selection word line voltages Vwl_unsel1 to Vwl_unselk may linearly increase or decrease. The non-selection word line voltage generator 137 may be implemented in the above-described linear voltage generator.

Meanwhile, a linear voltage generator according to an embodiment of the disclosure may be configured to independently generate voltages based on a word line zone.

Figure 19:
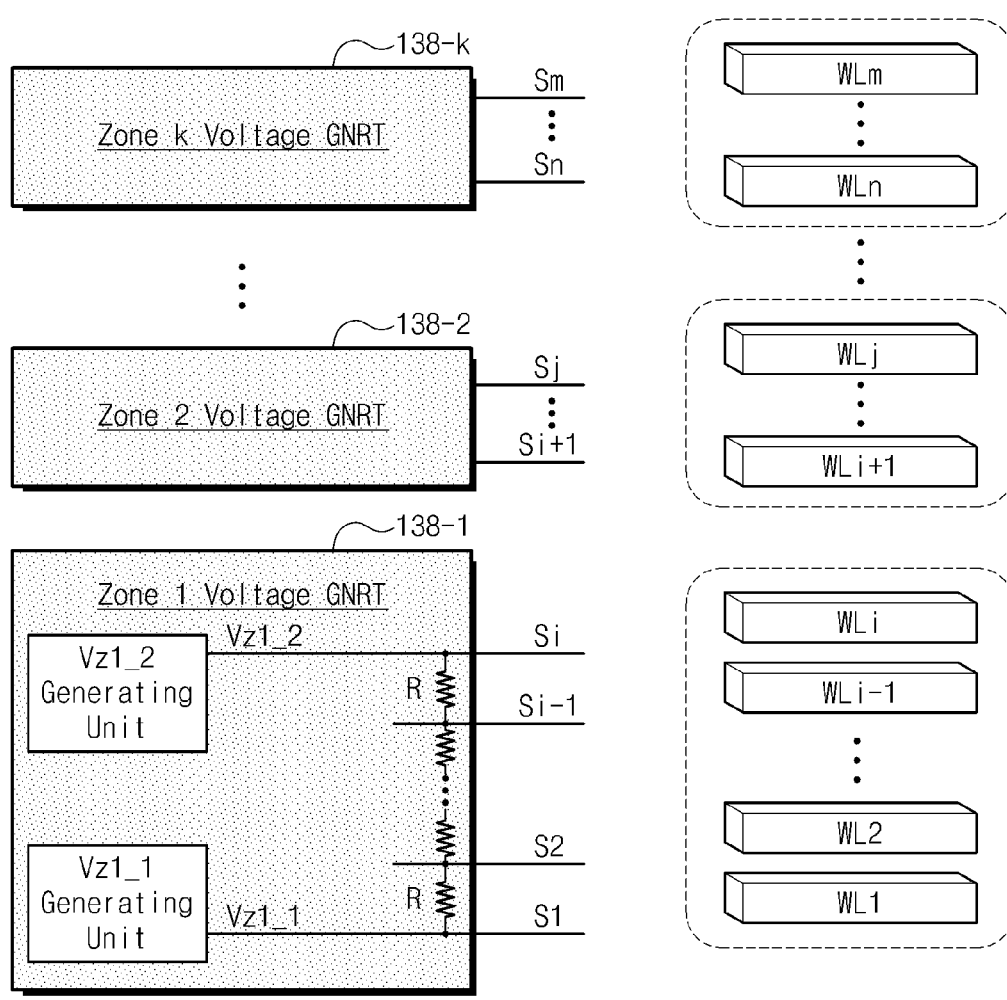
FIG. 19 is a diagram illustrating a method for generating voltages independently required for each zone of word lines according to an embodiment of the disclosure.

FIG. 19 is a diagram illustrating a method for generating voltages independently required for each word line zone, according to an embodiment of the disclosure. Referring to FIG. 19, a plurality of zone-voltage generators 138-1 to 138-k may generate linear voltages applied to corresponding zones, respectively. The plurality of zone-voltage generators 138-1 to 138-k may be implemented in the above-described linear voltage generator. Zone-voltage generator 138-1 may include a Vz1_1 generating unit and VZ1_2 generating unit to respectively generate voltages VZ1_1 and Vz1_2. Zone-voltage generators 138-2 through 138_k may be similarly configured.

Figure 20:
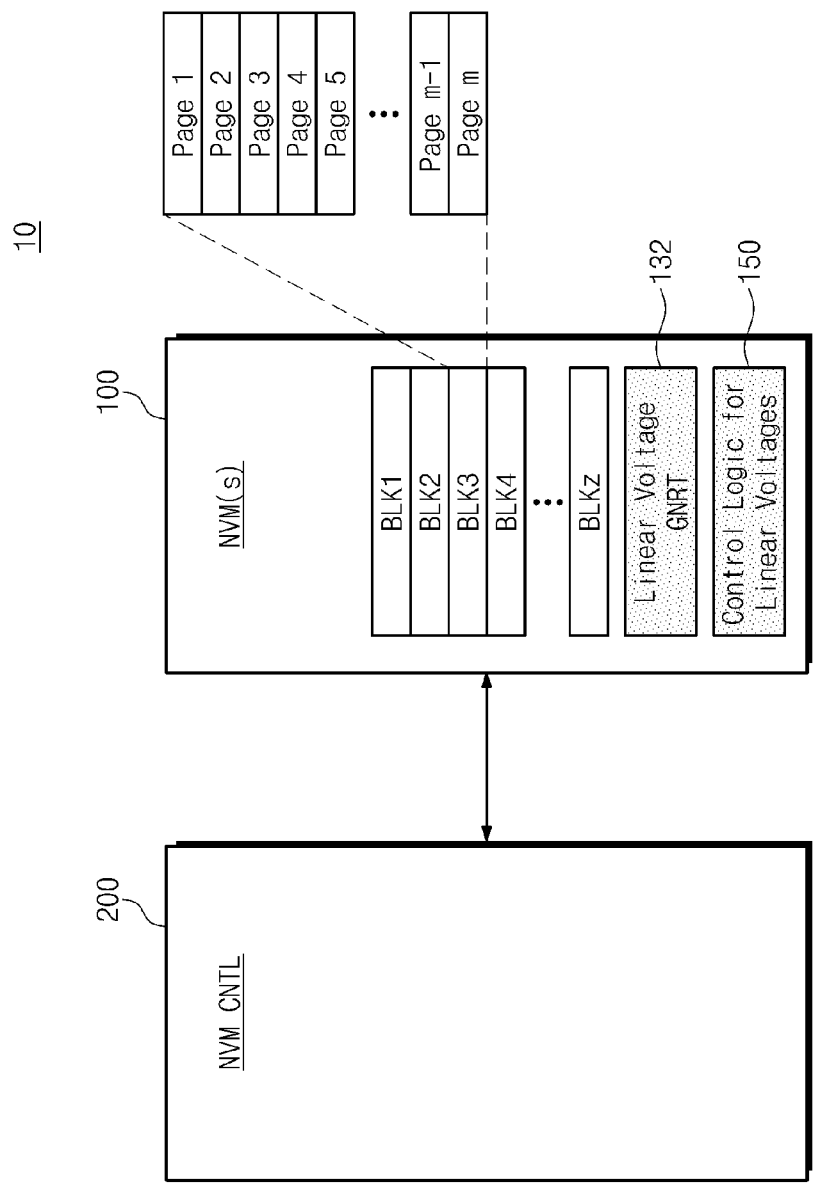
FIG. 20 is a diagram illustrating a storage device according to an embodiment of the disclosure.

FIG. 20 is a diagram illustrating a storage device according to an embodiment of the disclosure. Referring to FIG. 20, a storage device 10 may include at least one nonvolatile memory 100 and a memory controller 200 for controlling the nonvolatile memory 100.

The nonvolatile memory device 100 may include a plurality of blocks BLK1 to BLKz (z being an integer greater than or equal to 2) and a control logic 150 controlling operations of the blocks BLK1 to BLKz. Each of the blocks BLK1 to BLKz may include a plurality of pages 1 to m (m bring an integer greater than or equal to 2).

During a program/read/erase operation, the control logic 150 may control the linear voltage generator 132 in response to external/internal environment information or a signal generated in hardware/firmware/software, so as to generate and/or apply linear voltages. In this case, as described FIGS. 1 to 19, the line voltage generator 132 may be applied to all or a portion of adjacent word lines and may generate word line voltages which linearly increase or decrease.

Figure 21:
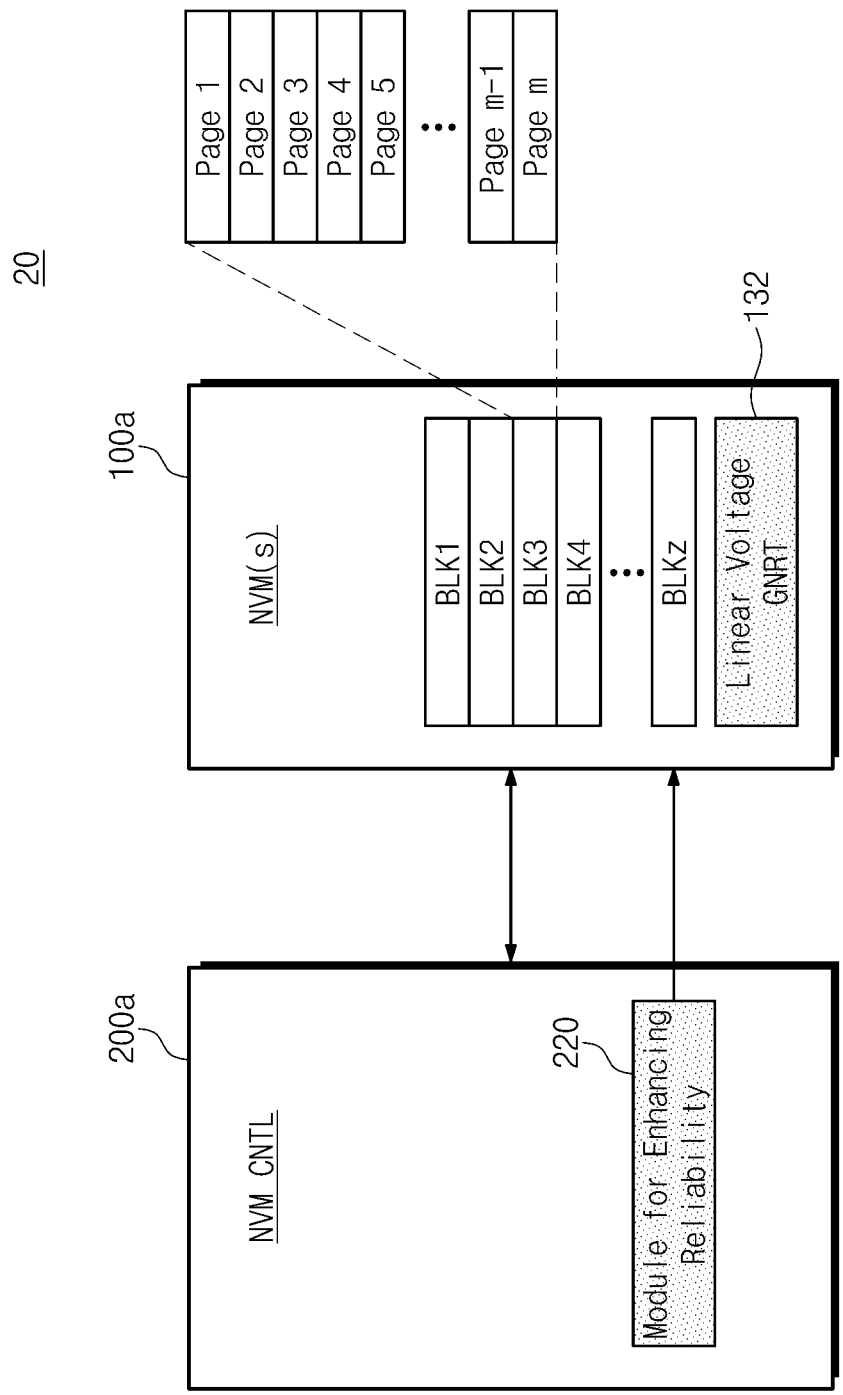
FIG. 21 is a diagram illustrating a storage device according to another embodiment of the disclosure.

FIG. 21 is a diagram illustrating a storage device according to another embodiment of the disclosure. Referring to FIG. 21, a storage device 20 may include at least one nonvolatile memory 100a and a memory controller 200a for controlling the nonvolatile memory 100a.

The memory controller 200a may include a module 220 for enhancing reliability. When it is necessary to improve reliability of the nonvolatile memory device 100a, as determined based on an internal algorithm, the module 220 of the memory controller 200a may request the nonvolatile memory device 100 to activate the linear voltage generator 132.

Figure 22:
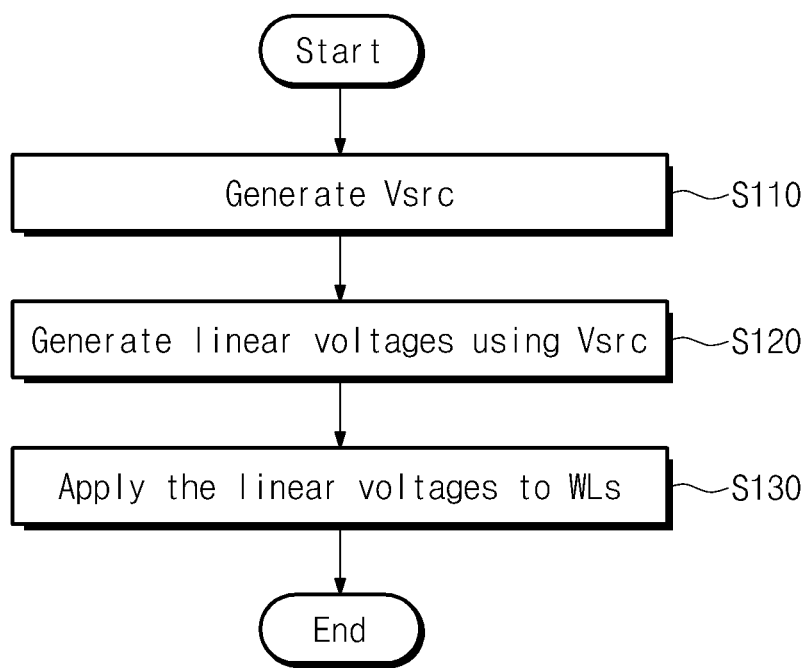
FIG. 22 is a flowchart illustrating an operating method of a nonvolatile memory device according to an embodiment of the disclosure.

FIG. 22 is a flowchart illustrating an operating method of a nonvolatile memory device according to an embodiment of the disclosure. Below, an operating method of the nonvolatile memory device will be described with reference to FIGS. 1 to 22.

During a program/read/erase operation, a source voltage Vsrc may be generated (S110). In an embodiment, the source voltage Vsrc may be generated by dividing an external/internal voltage/power supply voltage. In another embodiment, the source voltage Vsrc may be generated by performing charge pumping of a power supply voltage. A plurality of linear voltages may be generated by dividing a voltage between a source voltage Vsrc and a ground voltage GND using resistors (S120, refer to FIGS. 4 to 6). Afterwards, the generated linear voltages may be applied to word lines WLs (S130).

Meanwhile, an operating method illustrated in FIG. 22 is an example, and the scope and spirit of the disclosure may not be limited thereto. An order of an operating method illustrated in FIG. 22 may be changed, and a portion of operations thereof may be omitted.

Figure 23:
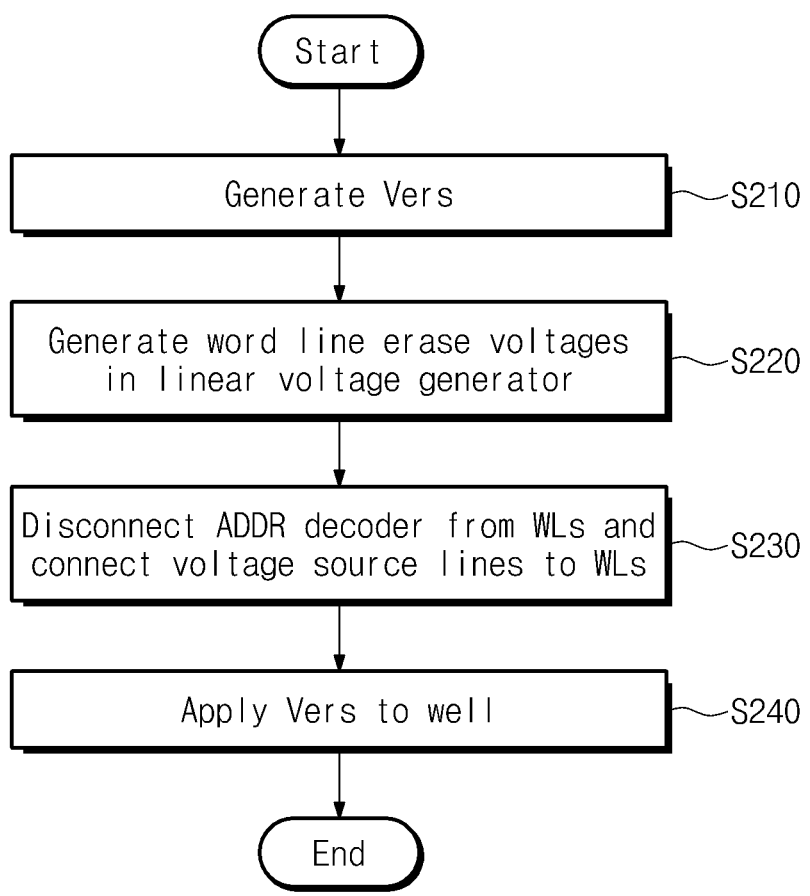
FIG. 23 is a flowchart illustrating an erase method of a nonvolatile memory device according to an embodiment of the disclosure.

FIG. 23 is a flowchart illustrating an erase method of a nonvolatile memory device according to an embodiment of the disclosure. Below, an erase operation of the nonvolatile memory device will be described with reference to FIGS. 1 to 23.

An erase voltage Vers may be generated (S210). In this case, the erase voltage Vers may be a value corresponding to a program loop and may increase as the number of program loops increases (S210). Word line erase voltages required for erase operations may be generated by the linear voltage generator. The waveform of the generated word line erase voltages may be similar to that of cell characteristics as described in FIGS. 13 to 16 (S220). Afterwards, the voltage source lines having word line erase voltages may be directly connected to the word lines WL without electrically connecting the word lines WL to the address decoder 120 (refer to FIG. 1) (S230). Afterwards, an erase voltage Vers may be applied to a well corresponding to a memory block (S240).

Meanwhile, an erase method illustrated in FIG. 23 is an example, and the scope and spirit of the disclosure may not be limited thereto. An erase operation according to an embodiment of the disclosure may be changed in order, and a portion of the erase operation may be omitted.

Figure 24:
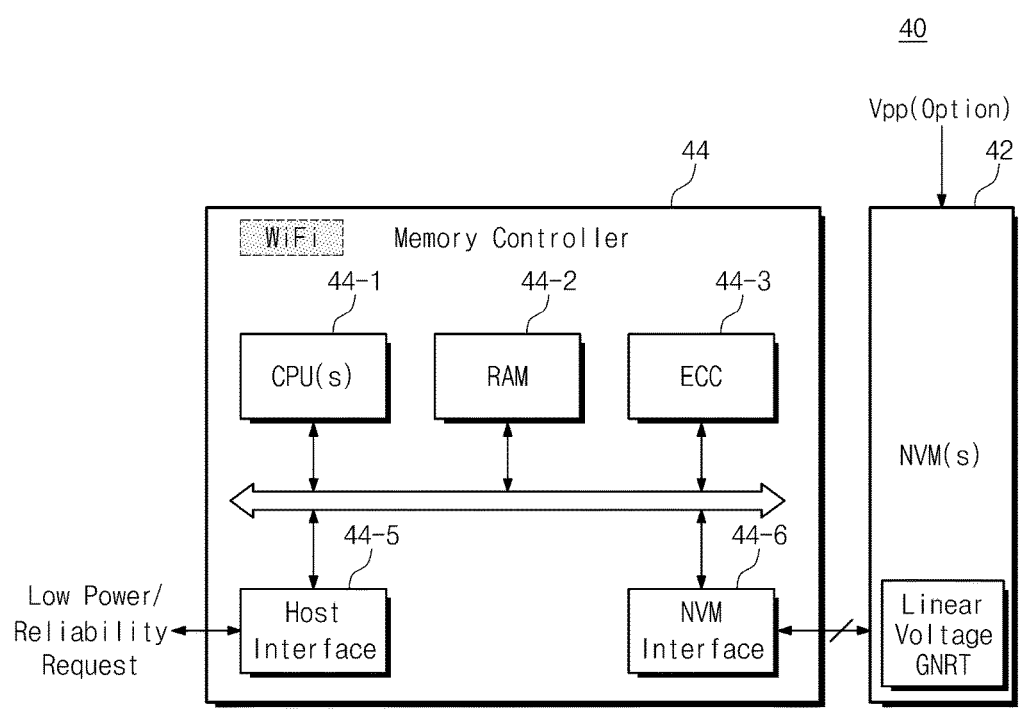
FIG. 24 is a block diagram illustrating a memory system according to an embodiment of the disclosure.

FIG. 24 is a block diagram illustrating a memory system according to an embodiment of the disclosure. Referring to FIG. 24, a memory system 40 may include at least one nonvolatile memory device 42 and a memory controller 44 for controlling the nonvolatile memory 42. The memory system 40 illustrated in FIG. 24 may be used as a storage medium such as a memory card (e.g., CF, SD, microSD, etc.) and a USB storage device.

The nonvolatile memory device 42 may be configured to include a linear voltage generator for generating a linear voltage as described in FIGS. 1 to 23.

The memory controller 44 may control a read operation, a write operation, an erase operation, and the like of the nonvolatile memory device 42 in response to a request from a host. The memory controller 44 may include at least one central processing unit (CPU) 44-1, a buffer memory 44-2, an error correction code circuit 44-3, a host interface 44-5, and a nonvolatile memory interface 44-6.

The central processing unit 44-1 may control an overall operation (e.g., a read, a write, file system management, bad page management, etc.) of the nonvolatile memory device 42. The RAM 44-2 may operate under a control of the central processing unit 44-1 and may be used as a work memory, a buffer memory, a cache memory, and the like. When the RAM 44-2 is used as the work memory, data processed by the central processing unit 44-1 may be temporarily stored in the RAM 44-2. When the RAM 44-2 is used as the buffer memory, the RAM 44-2 may be used for buffering data to be transmitted from the host to the nonvolatile memory device 42 or from the nonvolatile memory device 42 to the host. When the RAM 44-2 is used as the cache memory, the nonvolatile memory device 42 with a low speed may operate at a high speed.

The error correction code (ECC) circuit 44-3 may generate an error correction code (ECC) so as to correct a fail bit or an error bit of data received from the nonvolatile memory device 42. The error correction code (ECC) circuit 44-3 may perform an error correction encoding with respect to the data provided to the nonvolatile memory device 42 and may store data in which a parity bit is added. The parity bit may be stored in the nonvolatile memory device 42. Moreover, The ECC circuit 44-3 may perform an error correction decoding with respect to data outputted from the nonvolatile memory device 42. The ECC circuit 44-3 may correct an error using a parity bit. The ECC circuit 44-3 may correct an error using a coded modulation such as a low density parity check (LDPC) code, a Bose, Chaudhuri, Hocquenghem (BCH) code, a turbo code, a Reed-Solomon code, a convolution code, a recursive systematic code (RSC), a trellis-coded modulation (TCM), or a block coded modulation (BCM).

The memory controller 44 may exchange data with the host through the host interface 44-5 and may exchange data with the non-volatile memory device 42 through an NVM interface 44-6. The host interface 44-5 may be connected to the host through a parallel AT attachment (PATA) bus, a serial AT attachment (SATA) bus, a small computer system interface (SCSI), a universal serial bus (USB), a peripheral component interconnect express (PCIe), a secure-digital (SD) card interface, SAS, a universal flash storage (UFS) interface, a NAND interface, and the like. In an embodiment, the memory controller 44 may install a wireless communication function (e.g., Wi-Fi).

A storage device 40 according to an embodiment of the disclosure may control to generate and/or apply a linear voltage in response to a host request, thereby improving the data reliability.

An embodiment of the disclosure may be applied to a solid state drive (SSD).

Figure 25:
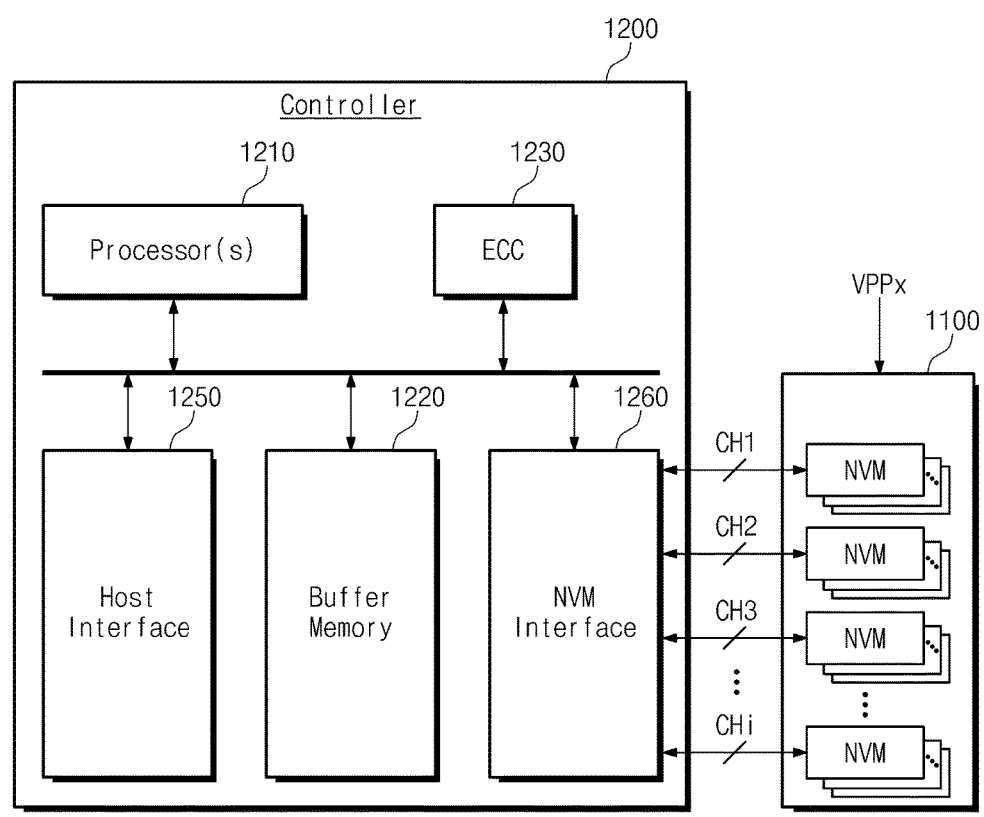
FIG. 25 is a block diagram illustrating a SSD according to an embodiment of the disclosure.

FIG. 25 is a block diagram illustrating an SSD according to an embodiment of the disclosure. Referring to FIG. 25, an SSD 1000 may include a plurality of nonvolatile memory devices 1100 and a controller 1200.

The nonvolatile memory devices 1100 may be configured to optionally receive an external high-voltage Vppx. Each of the nonvolatile memory devices 1100 may be implemented with the nonvolatile memory device as described with reference to FIGS. 1 to 24. The controller 1200 may be connected to the nonvolatile memory devices 1100 through a plurality of channels CH1 to Chi (i being an integer of 2 or more). The controller 1200 may be implemented with the memory controller as described with reference to FIGS. 1 to 21.

The controller 1200 may include at least one processor 1210, a buffer memory 1220, an error correction code (ECC) circuit 1230, a host interface 1250, and a nonvolatile memory interface 1260.

The buffer memory 1220 may temporarily store data needed for an operation of the memory controller 1200. The buffer memory 1220 may include a plurality of memory lines for storing data or a command Here, a plurality of memory lines may be mapped to cache lines using various methods. The buffer memory 1220 may store page bit map information and read count information. During a power-up sequence, the page bit map information or the read count information may be read from the nonvolatile memory device 1100 and may be updated according to an internal operation. The updated page bitmap information or read count information may be periodically or non-periodically stored in the nonvolatile memory device 1100.

The error correction code circuit 1230 may calculate a value of an error correction code of data to be programmed at a writing operation, may correct data read at a read operation based on the value of the error correction code, and may correct an error of data recovered on the nonvolatile memories 1100 in a recovery operation. Even though not illustrated, a code memory for storing code data required for an operation of the controller 1200 may be further included. The code memory may be implemented with a nonvolatile memory.

The host interface 1250 may provide an interface function for interfacing with an external device. Here, the host interface 1250 may be a NAND flash interface. Besides, the host interface 1250 may be implemented by various interfaces and may be implemented with a plurality of interfaces. The nonvolatile memory interface 1260 may provide a function as a nonvolatile memory device 1100 and an interface function.

The SSD 1000 according to an embodiment of the disclosure may generate linear voltages to be fit to physical/structural characteristics of word lines, thereby greatly improving the data reliability. For this reason, the SSD 1000 may be applied to a server in a data center.

Figure 26:
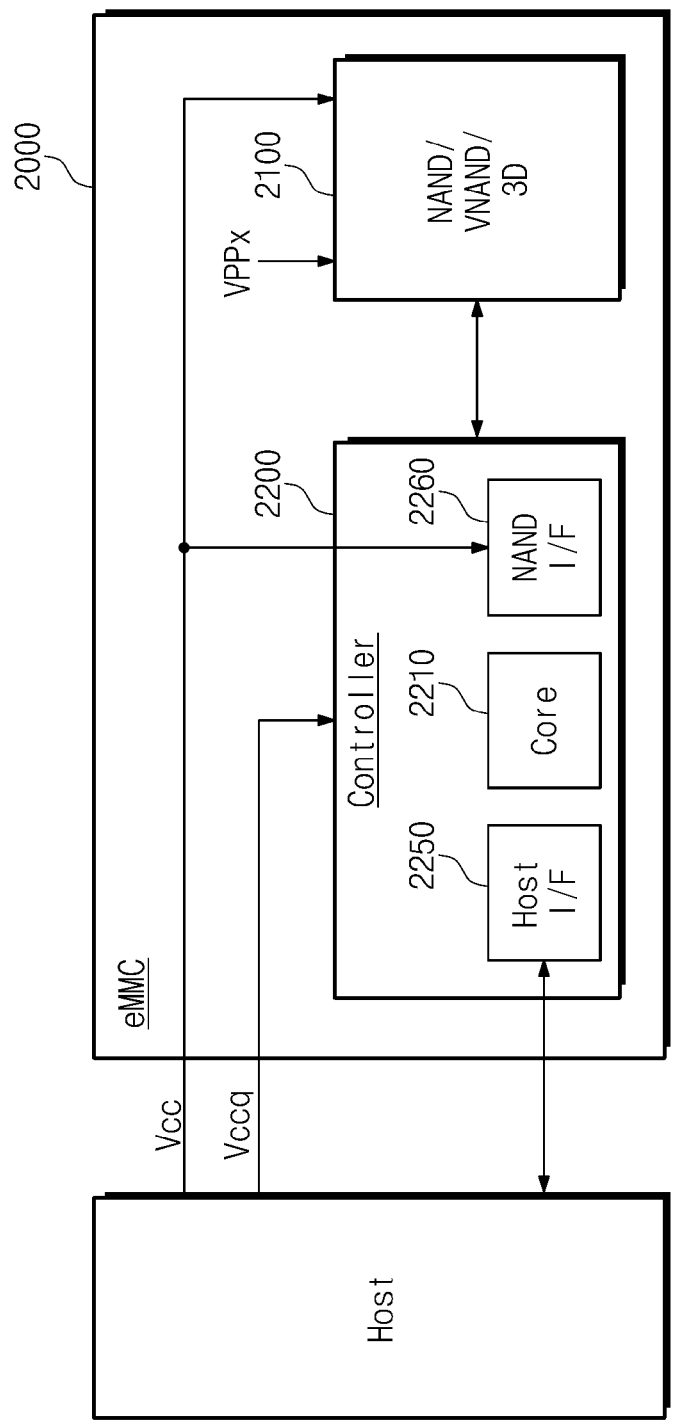
FIG. 26 is a block diagram illustrating an embedded multimedia card (eMMC) according to an embodiment of the disclosure.

An embodiment of the disclosure may be also applied to an embedded multimedia card (eMMC), moviNAND, or iNAND. FIG. 26 is a block diagram illustrating an embedded multimedia card (eMMC) according to an embodiment of the disclosure. Referring to FIG. 26, an embedded multimedia card (eMMC) 2000 may include at least one NAND flash memory device 2100 and a controller 2200.

The NAND flash memory device 2100 may be implemented with the nonvolatile memory device as described with reference to FIGS. 1 to 24. The nonvolatile memory device 2100 may generate linear voltages. The controller 2200 (e.g., a memory controller) may include at least one controller core 2210, a host interface 2250, and a NAND interface 2260. The controller core 2210 may control an overall operation of the eMMC 2000. The host interface 2250 may interface between a controller 2210 and a host. The NAND interface 2260 may interface between the NAND flash memory device 2100 and the controller 2200. In an embodiment, the host interface 2250 may be a parallel interface (e.g., MMC interface). In another embodiment, the host interface 2250 in the eMMC 2000 may be a serial interface (e.g., UHS-II, UFS interface). In another embodiment, the host interface 2250 may be a NAND interface.

The eMMC 2000 may receive power supply voltages Vcc and Vccq from the host. Here, a first power voltage Vcc (e.g., 3.3 V) may be provided to the NAND flash memory device 2100 and the NAND interface 2260, and a second power voltage Vccq (e.g., 1.8 V/3.3 V) may be provided to the controller 2200. In an embodiment, the eMMC 2000 may optionally receive an external high-voltage Vppx.

The eMMC 2000 according to an embodiment of the disclosure may improve data reliability, thereby reducing the probability of error occurrence. This may mean that the eMMC 200 operates at high speed.

Figure 27:
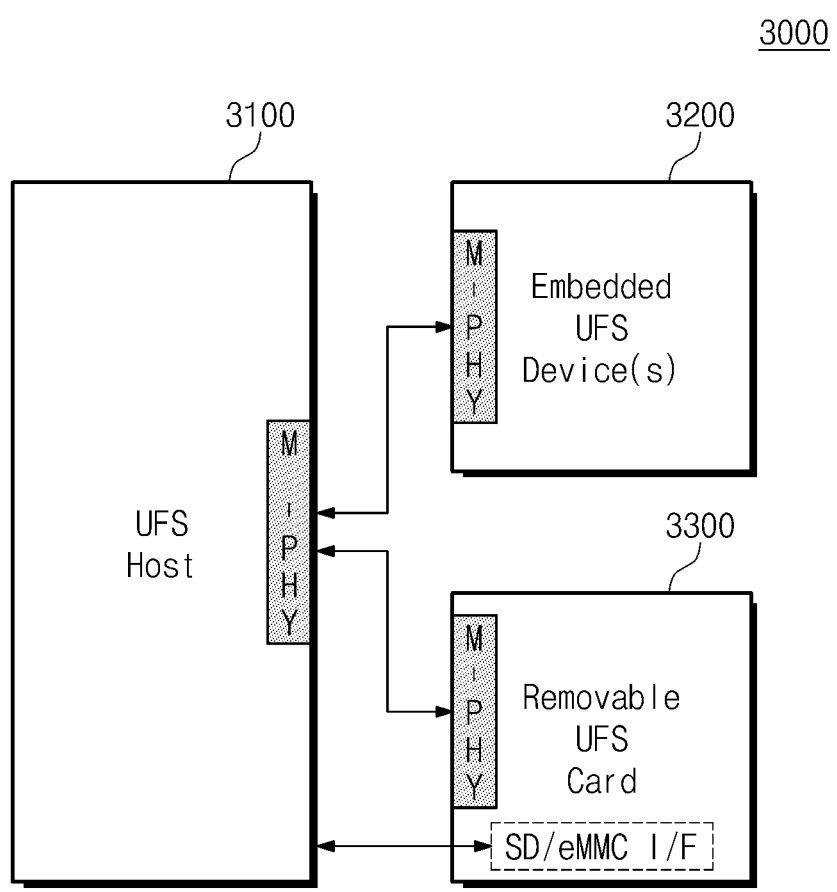
FIG. 27 is a block diagram illustrating an universal flash storage (UFS) system according to an embodiment of the disclosure.

An embodiment of the disclosure may be also applied to a universal flash storage (UFS). FIG. 27 is a block diagram illustrating a universal flash storage (UFS) system according to an embodiment of the disclosure. Referring to FIG. 27, a UFS system 3000 may include a UFS host 3100, at least one embedded UFS device 3200, and a removable UFS card 3300. A communication between the UFS host 3100 and the embedded UFS device 3200, and a communication between the UFS host 3100 and the removable UFS card 3300 may be performed through an M-PHY layer.

At least one of the embedded UFS device 3200, and the removable UFS card 3300 may be implemented with the storage device 10 described in FIG. 20, may be implemented with the storage device 20 described FIG. 21 or may be implemented with the memory system 40 described in FIG. 24.

Meanwhile, a UFS host 3100 may include a bridge to communicate with the removable UFS card 3400 based on another protocol different from a UFS protocol. The UFS host 3100 and the removable UFS card 3400 may communicate with each other through various card protocols (e.g., a universal serial bus flash drive (UFDs), a multimedia card (MMC), an embedded multimedia card (eMMC), a secure digital (SD), a mini SD, a Micro SD).

Figure 28:
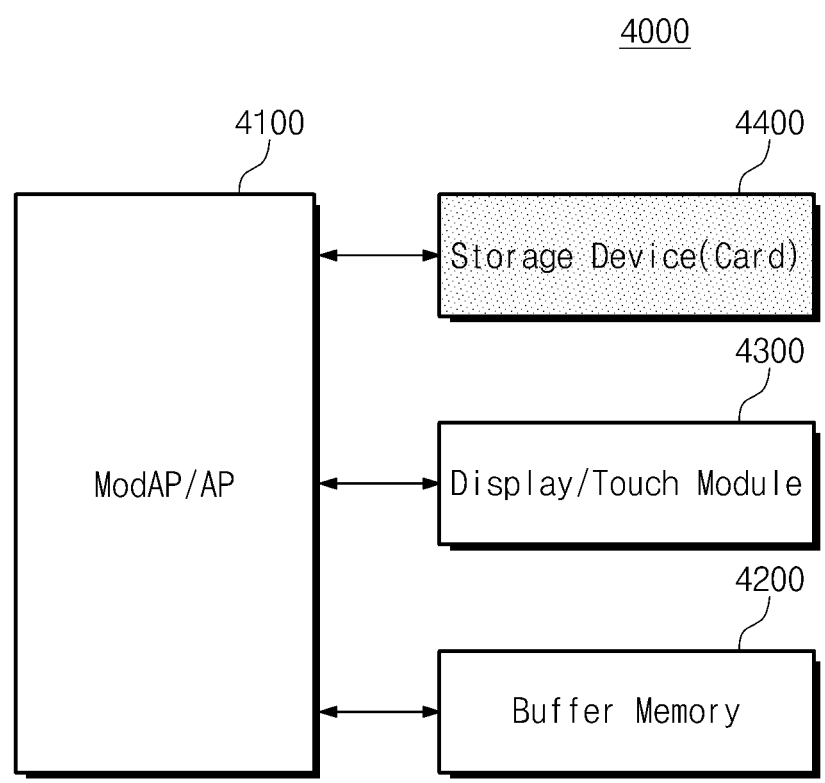
FIG. 28 is a block diagram illustrating a mobile device according to an embodiment of the disclosure.

An embodiment of the disclosure may be also applied to a mobile device. FIG. 28 is a block diagram illustrating a mobile device 4000 according to an embodiment of the disclosure. Referring to FIG. 28, a mobile device 4000 may include an integrated/application processor (AP/ModAP) 4100, a buffer memory 4200, a display/touch module 4300, and a storage device (card) 4400.

The processor 4100 may be configured to control an overall operation of the mobile device 4000 and a wired/wireless communication between the mobile device and an external device. The buffer memory 4200 may be configured to temporarily store data, which is needed when the mobile device 4000 performs a process operation. The display/touch module 4300 may be configured to display data processed from the processor 4100 or to receive data from a touch panel. The storage device 4400 may be configured to store data of a user. The storage device 4400 may be eMMC, SSD, UFS, or the like. The storage device 4400 may be implemented with the storage device 10 illustrated in FIG. 20, may be implemented with the storage device 20 illustrated in FIG. 21 or may be implemented with the memory system 40 illustrated in FIG. 24.

Figure 29A:
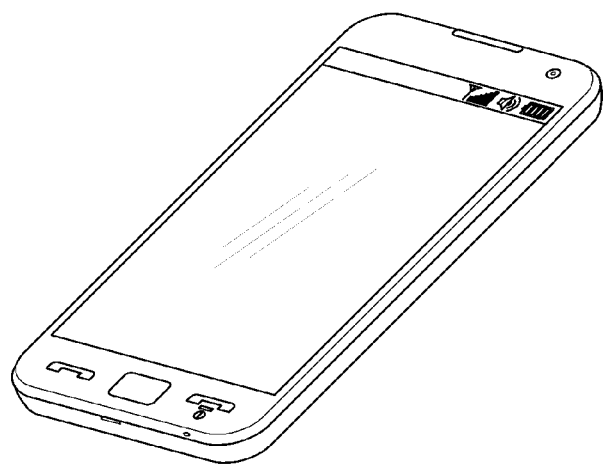
FIGS. 29A, 29B, and 29C are diagrams illustrating a smart phone, a wearable watch, and a smart glass.
Figure 29B:
Figure 29C:
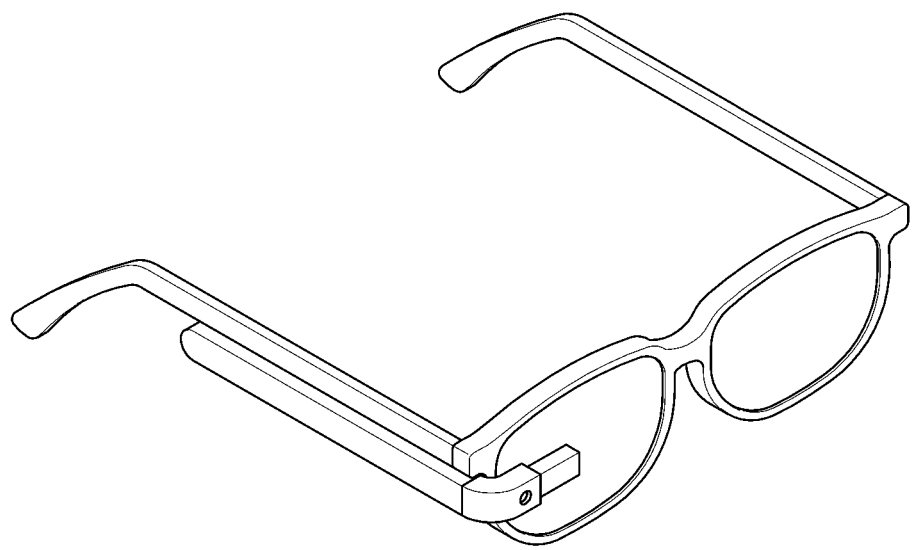

Meanwhile, the above-mentioned mobile device 4000, as illustrated in FIGS. 29A, 29B, and 29C, respectively, may be applied to various electronic devices such as a smart phone, a wearable watch, or a smart glass. That is, a mobile device 4000 according to an embodiment of the disclosure may be applied to various kinds of IOT (i.e., internet of things) products.

A memory system or a storage device according to an embodiment of the disclosure may be packaged according to any of a variety of different packaging technologies. In an embodiment, a memory system or a storage device according to an embodiment of the disclosure may be mounted using packaging technologies. Examples of such packaging technologies may include the following: package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

As described above, a nonvolatile memory device, a storage device having the same, and a method thereof according to an embodiment of the disclosure may generate and/or apply linear voltages based on word line positions, thereby improving the data reliability of memory cells.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

Therefore, it should be understood that the above embodiments are not limiting, but illustrative. The disclosure specifically and can actually be used in its own unit, as well as the abstract, and will include a conceptual idea of the technical concept that can be used as a future technology.

While the disclosure has been described with reference to exemplary embodiments, it will be apparent to those skilled in the art that various changes and modifications may be made without departing from the spirit and scope of the disclosure. Therefore, it should be understood that the above embodiments are not limiting, but illustrative.

What is claimed is:

1. A nonvolatile memory device comprising:
a plurality of memory blocks having a plurality of strings which are perpendicular to a substrate and are connected to one bit line, wherein each of the cell strings comprises a plurality of memory cells corresponding to word lines, respectively; and
a voltage generating circuit configured to generate voltages that are applied to word lines corresponding to a memory block selected from the memory blocks, wherein:
the voltage generating circuit comprises:
voltage source lines having the voltages corresponding to the word lines;
a first voltage generating unit configured to generate a first voltage and apply the first voltage to a first voltage source line of the voltage source lines;
a second voltage generating unit configured to generate a second voltage and apply the second voltage to a second voltage source line of the voltage source lines; and
a resistor string connected between the first voltage source line and the second voltage source line, and
at least one of the voltage source lines has a voltage between the first voltage and the second voltage divided using the resistor string.

2. The nonvolatile memory device of claim 1, wherein each of the first and second voltage generating units comprises:
a variable resistor string connected between a power supply terminal and a ground terminal; and
a voltage follower configured to output a division voltage between a source voltage applied to the power supply terminal and a ground voltage of the ground terminal as the first voltage or the second voltage.

3. The nonvolatile memory device of claim 2, further comprising a source voltage generator configured to generate the source voltage.

4. The nonvolatile memory device of claim 1, wherein waveforms of the voltages linearly increase from the first voltage to the second voltage, linearly decrease from the first voltage to the second voltage, are maintained with the first voltage, or are maintained with the second voltage.

5. The nonvolatile memory device of claim 1, further comprising at least one third voltage generating unit configured to generate a third voltage and apply the third voltage to a third source line of the voltage source lines.

6. The nonvolatile memory device of claim 5, wherein the at least one third voltage generating unit further comprises a switch transistor configured to determine whether to apply the third voltage to the third voltage source line.

7. The nonvolatile memory device of claim 5, wherein the at least one third voltage generating unit further comprises:
a first switch transistor configured to determine whether to apply the third voltage to the third voltage source line; and
at least one second switch transistor configured to determine whether to apply the third voltage to a fourth voltage source line of the voltage source lines.

8. The nonvolatile memory device of claim 1, wherein the voltage generating circuit further comprises pass transistors configured to connect the word lines to the voltage source lines.

9. The nonvolatile memory device of claim 8, wherein the voltage generating circuit further comprises a high-voltage level shifter configured to convert a voltage level of an enable signal and apply the converted enable signal to gates of the pass transistors.

10. The nonvolatile memory device of claim 1, wherein:
the voltage generating circuit further comprises:
an erase voltage generator configured to generate an erase voltage that is applied to a well of the selected memory block; and
a word line erase voltage generator configured to generate word line erase voltages that are applied to word lines of the selected memory block, and
the word line erase voltage generator comprises a linear voltage generator.

11. The nonvolatile memory device of claim 1, wherein:
the voltage generating circuit further comprises:
a selection word line voltage generator configured to generate a word line voltage that is applied to a word line of the selected memory block; and
a non-selection word line voltage generator configured to generate non-selection word line voltages that are applied to unselected word lines of the selected memory block, and
the non-selection word line voltage generator comprises a linear voltage generator.

12. The nonvolatile memory device of claim 1, wherein:
the word lines are divided into a plurality of zones,
the voltage generating circuit further comprises a plurality of zone-voltage generators corresponding to the plurality of zones, each of the zone-voltage generators configured to generate word line voltages that are applied to word lines of a corresponding zone, and
at least one of the zone-voltage generators comprises a linear voltage generator.

13. A method of operating a nonvolatile memory device having a plurality of strings perpendicular to a substrate, the method comprising:
generating a source voltage;
generating linear voltages by dividing a voltage between the source voltage and a ground voltage using a resistor string; and
applying the linear voltages to word lines, wherein
the linear voltages are word line voltages which linearly increase or decrease at all or a portion of adjacent word lines during a program, a read, or an erase operation.

14. The method of claim 13, further comprising setting waveforms of linear voltages based on positions of word lines of a selected memory block.

15. The method of claim 13, further comprising:
generating an erase voltage during an erase operation; and
applying the erase voltage to a well of a selected memory block.

16. The method of claim 15, wherein the applying of the linear voltages comprises:
electrically isolating the word lines from an address decoder during the erase operation; and
connecting the word lines to voltage source lines having the linear voltages.

17. A nonvolatile memory device comprising:
word lines; and
an erase voltage generator configured to generate word line erase voltages that are applied to the word lines during an erase operation, wherein:
the erase voltage generator comprises:
pass transistors configured to electrically connect the word lines to voltage source lines;

a resistor string configured to electrically connect the voltage source lines;

a plurality of voltage generating units configured to generate voltages corresponding to a portion of the voltage source lines and apply the generated voltages to the corresponding voltage source lines; and a high-voltage level shifter configured to receive an enable signal during the erase operation and convert a level of the enable signal, and the pass transistors are turned on in response to the level-converted enable signal.

18. The nonvolatile memory device of claim 17, further comprising a switch transistor configured to connect at least one of the voltage generating units to a corresponding voltage source line through a switching operation.

19. The nonvolatile memory device of claim 17, further comprising switch transistors configured to connect at least two of the voltage source lines to at least one of the voltage generating units through a switching operation.

20. The nonvolatile memory device of claim 17, further comprising a three dimensional (3D) memory array.

* * * * *